US008697545B2

(12) United States Patent (10) Patent No.: US 8,697,545 B2
Nabki et al. (45) Date of Patent: Apr. 15, 2014

(54) DIRECT CONTACT HEAT CONTROL OF MICRO STRUCTURES

(75) Inventors: Frederic Nabki, Longueuil (CA); Mourad El-Gamal, Brossard (CA); Tomas A. Dusatko, Vancouver (CA)

(73) Assignee: The Royal Institution for the Advancement of Learning/McGill University, Montreal, Quebec (CA)

(*) Notice: Subject to any disclaimer, the term of this patent is extended or adjusted under 35 U.S.C. 154(b) by 135 days.

(21) Appl. No.: 12/810,883

(22) PCT Filed: Dec. 29, 2008

(86) PCT No.: PCT/CA2008/002243
§ 371 (c)(1),
(2), (4) Date: Jun. 28, 2010

(87) PCT Pub. No.: WO2009/082812
PCT Pub. Date: Jul. 9, 2009

(65) Prior Publication Data
US 2010/0279451 A1 Nov. 4, 2010

Related U.S. Application Data

(60) Provisional application No. 61/006,175, filed on Dec. 28, 2007.

(51) Int. Cl.
*H01L 21/30* (2006.01)

(52) U.S. Cl.
USPC .......................................... 438/459

(58) Field of Classification Search
None
See application file for complete search history.

(56) References Cited

U.S. PATENT DOCUMENTS

| | | | |
|---|---|---|---|
| 2002/0105396 A1* | 8/2002 | Streeter et al. | 335/78 |
| 2004/0232535 A1* | 11/2004 | Tarn | 257/680 |
| 2007/0041703 A1* | 2/2007 | Wang | 385/147 |
| 2008/0003779 A1* | 1/2008 | Sawyer | 438/459 |

* cited by examiner

*Primary Examiner* — Charles Garber
*Assistant Examiner* — Andre' C Stevenson
(74) *Attorney, Agent, or Firm* — Freedman & Associates

(57) ABSTRACT

A method for manufacturing microelectromechanical structures (MEMS) is disclosed. A low temperature MEMS device is designed. The low temperature MEM device is based upon a semiconductor manufacturing process comprising at least one semiconductor process for providing at least a heater therein. Each semiconductor process used in implementing the design is limited to a maximum temperature of the in-process low temperature MEMs device or a substrate onto which the low temperature MEMS device is being manufactured to below 300° C.

22 Claims, 15 Drawing Sheets

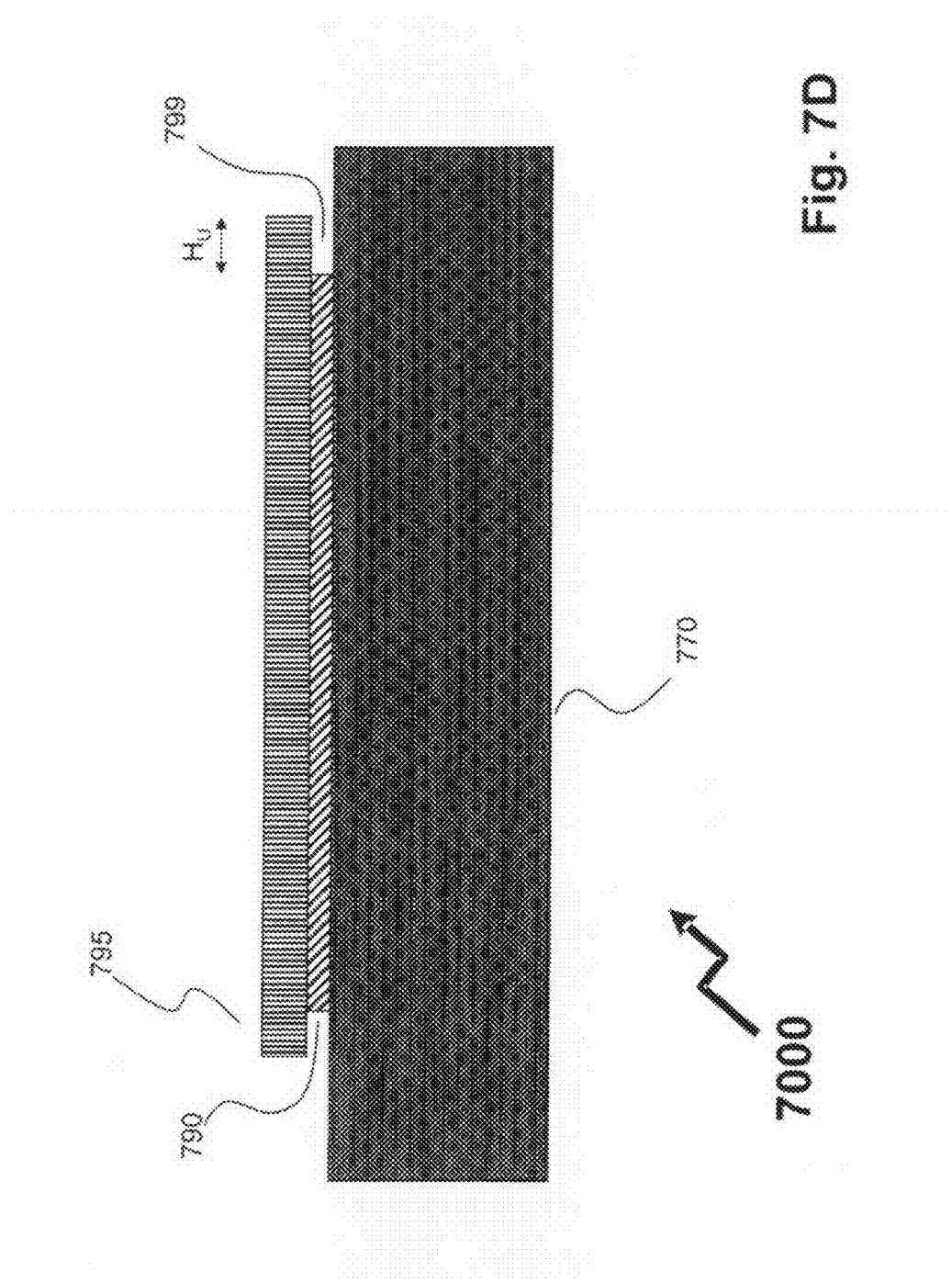

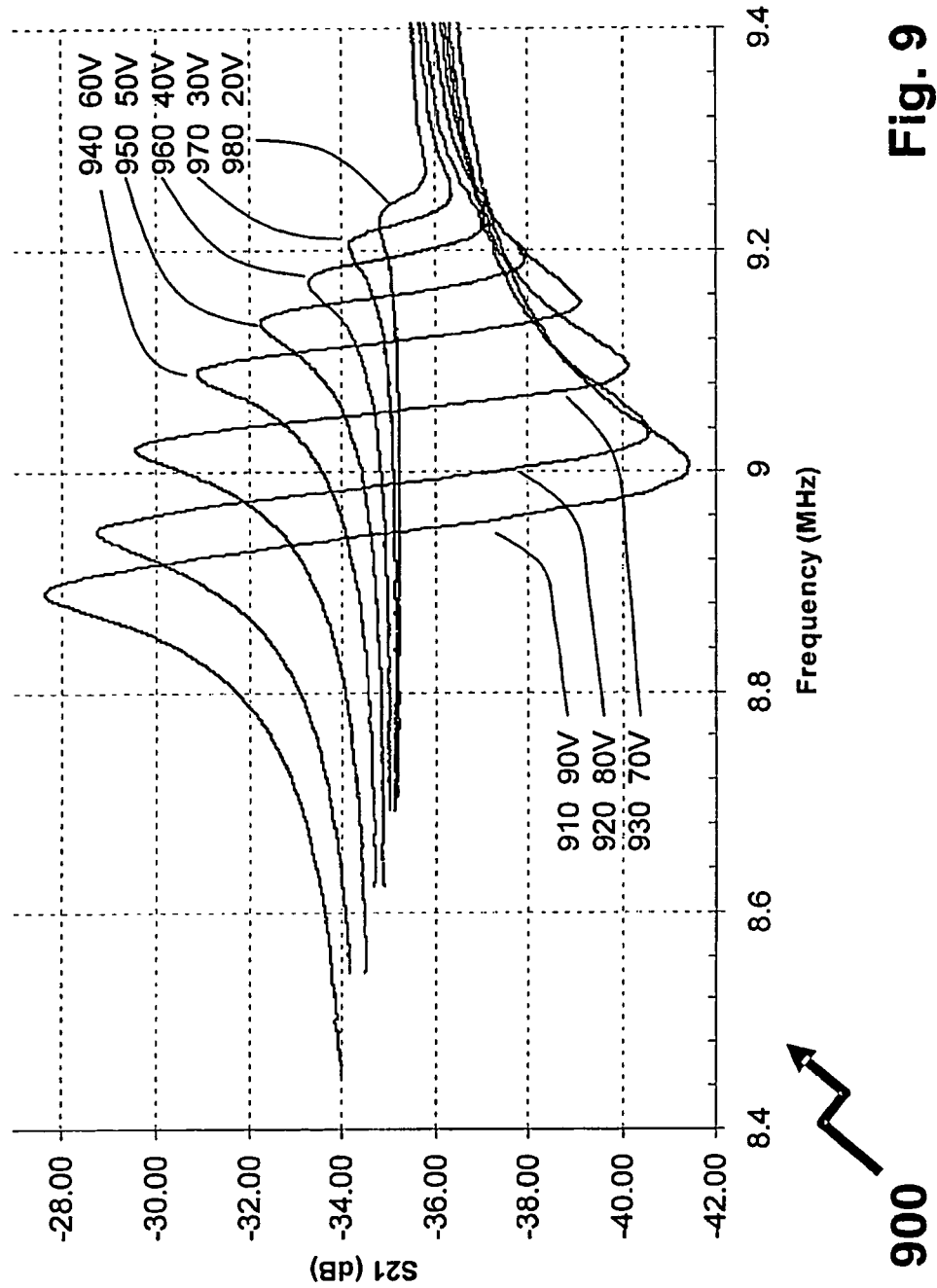

DIRECT CONTACT HEAT CONTROL OF MICRO STRUCTURES

FIELD OF THE INVENTION

The invention relates to control of microelectromechanical structures (MEMS) and more particularly to the tuning and alignment of microelectromechanical (MEM).

BACKGROUND OF THE INVENTION

The introduction of integrated circuits (ICs) in the 20th century fundamentally changed the way engineers design electronic systems. In telecommunications, RF integrated circuits have performance requirements that are not readily or cheaply attainable using commercial IC technologies. These technologies are usually tailored to digital or more traditional analog designs and, consequently, are limited by the low quality (Q) factors of passive devices such as integrated inductors, capacitors, and filters. This forces engineers to design around performance limited IC devices, or to resort to hybrid integration strategies with off-chip circuit elements such as inductors, capacitors, crystals, and filters.

Today, the trend towards reduced cost, increased integration, and added functionality by solutions such as system-on-a-chip (SoC) renders off-chip components undesirable because of their impact on production quality, cost, and size. Recently, much attention has been focused on MEMS. MEMS are integrated devices or systems combining electrical and mechanical components/functionality. Their dimensions can range in size from the sub-micrometer level to the millimeter level, and there can be any number, from one, to few, to potentially thousands or millions in a particular system. Historically, MEMS devices have leveraged and extended the fabrication techniques developed for the silicon integrated circuit industry, namely lithography, doping, deposition, etching, etc. to add mechanical elements such as beams, gears, diaphragms, and springs to silicon circuits either as discrete devices or in combination with integrated silicon electronics.

Accordingly, MEMS offer the opportunity to integrate many RF sub-components on-chip, which have traditionally been implemented off-chip. This provides the microelectronics designer with a new toolset of devices and functionalities. A higher level of integration can be achieved, which translates into more functionality in the same form factor, and enables lighter, lower cost, and more portable wireless systems when applied to RF circuits and components. Compared to conventional integration-friendly devices such as integrated inductors, MEM components have the potential to offer better performance through enhanced Q-factors and lower activation power. Specifically, MEM resonators can provide flexible on-chip re-configurability and high filtering performance, and benefit from integration of the necessary signal provisioning, processing and control required from integrated electronics within the chip to which the MEM resonator is integrated.

MEM resonators have been in active development since the 1980s, and were conceptually introduced in the 1940s. In the early stages, frequency of operation of such devices were in the audio range, and integration remained a sought after mystery. More recently, developments in the field of MEMS packaging such as Y. T. Cheng, et al. ["Vacuum Packaging Technology using Localized Aluminum/Silicon-to-Glass Bonding" J. of MEMS, Vol. 11, No. 5, pp. 556-565, October 2002] and R. Legtenberg et al ["Electrically Driven Vacuum-Encapsulated Polysilicon Resonators" Sensors and Actuators A, Vol. 45, pp. 57-66, 1994] coupled with increasing developments on miniaturization have allowed high frequency operation making them an attractive alternative for RF systems.

In wireless systems, micromechanical resonators are attractive components to use as IF or image rejection filters as well as in frequency references, see for example C. Nguyen ["Microelectromechanical Devices for Wireless Communications," Proc. IEEE Intl. Conf. on MEMS, pp. 1-7, January 1998]. MEM resonator-based filters that achieve high-Q, low insertion loss, and exhibit elevated stability when used in oscillators are hence an attractive integration alternative. In addition, MEM resonators have a resonant frequency that depends on their operating conditions such as temperature, pressure, or ambient chemical content. By capitalizing on these variations, designers can use MEM resonators to measure different physical parameters with high accuracy. MEM resonators have already been considered for use in sensing applications of gas, vibration, ultrasound, chemical and biological sensing. In other filtering applications, MEM resonators have been investigated for use in such biomedical domains as artificial cochlear implants.

In order to become a relevant and competitive technology, similar to the recent integration developments of supra-IC bulk acoustic wave (BAW) filters, see for example A. Dubois et al. [, "Integration of high-Q BAW Resonators and Filters Above ICs", Proceedings of the IEEE Int. Solid-State Conf., Vol. 1, pp. 392-393, February 2005], MEM resonators require fabrication processes that are suited to integration with the dominant IC processes such as silicon-based CMOS. This enables the cost effective and efficient use of MEM resonators in the numerous sensing and filtering applications that are potential markets for the technology. Further, it would be advantageous if the MEM resonator fabrication process was compatible with not only silicon CMOS integration but the manufacturing of MEM resonators from materials offering enhanced performance compared to silicon such as ceramics including silicon carbide, silicon dioxide, and silicon nitride, and carbon including thin-film diamond. Such materials offering enhanced Young's modulus, high acoustic velocity, increased environmental tolerance enhanced chemical resilience and insulating structural layers for increased electrical design flexibility.

SUMMARY OF THE INVENTION

In accordance with the invention there is provided a method comprising: providing an integrated circuit as a first substrate; and providing at least a deposited MEM structure onto the first substrate wherein the deposited MEM structure comprises at least a heater for controllably heating of the MEM structure.

In accordance with the invention there is provided a method comprising: designing a low temperature MEM device, the low temperature MEM device based upon a semiconductor based manufacturing process comprising at least one semiconductor process for providing at least a heater, each of the at least a semiconductor process limiting the maximum temperature of at least one of the in-process low temperature MEM device and a substrate onto which the low temperature MEM device is being manufactured to below 300° C.

In accordance with the invention there is provided a method comprising: (a) providing a substrate; (b) providing at least one lower metallization; (c) providing at least a sacrificial layer; (d) providing at least one middle metallization; (e)

providing a structural layer; (f) providing at least one upper metallization; and (g) removing the at least one sacrificial layer.

In accordance with the invention there is provided a method comprising: (a) providing a substrate; (c) providing at least a sacrificial layer; (e) providing a structural layer; (g) removing the at least one sacrificial layer; and at least one of (b) providing at least one lower metallization; (d) providing at least one middle metallization; and, (f) providing at least one upper metallization.

In accordance with the invention there is provided a method comprising: (a) providing a MEM structure comprising a heater, an RF signal input port and an RF signal output port; (c) providing a signal at the RF signal input port; and (d) providing a heater potential, the heater potential applied to the heater; wherein heating of the MEM structure is dependent upon the heater potential and wherein tuning of an RF response of the MEM structure is responsive to heating of the MEM structure such that a signal at the RF output port is different as the MEM structure is heated for a same signal provided at the RF input port.

In accordance with the invention there is provided a method comprising: providing a substrate; and providing at least a deposited MEM structure onto the substrate wherein the deposited MEM structure comprises a heater.

In accordance with the invention there is provided a MEMS device comprising a structural element and a heater for controllably heating the structural element to affect performance of the MEMS device.

In accordance with the invention there is provided a CMOS integrated circuit comprising a MEMS structure formed thereon, the MEMS structure comprising a heater, the MEMS structure formed at a temperature for other than substantially affecting operation of the CMOS circuitry.

BRIEF DESCRIPTION OF THE DRAWINGS

Exemplary embodiments of the invention will now be described in conjunction with the following drawings, in which:

FIG. 7D illustrates a novel two-metal mask for etching a SiC structural layer.

FIG. 9 illustrates exemplary results for resonator tuning with varying bias voltage according to an embodiment of the invention;

DETAILED DESCRIPTION OF EMBODIMENTS OF THE INVENTION

Figure 1:
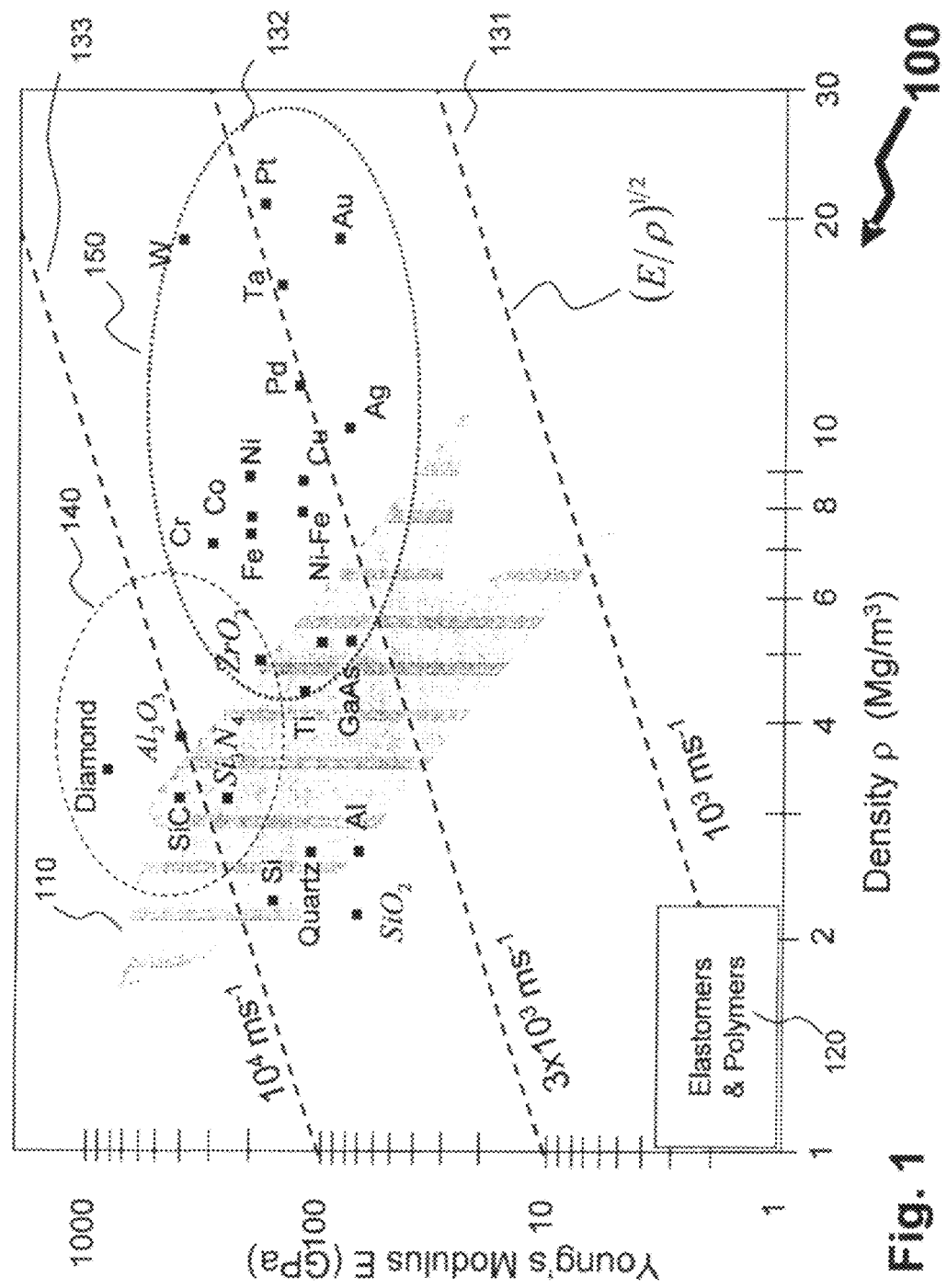
FIG. 1 illustrates the benefits of SiC for MEMS device implementations over Si.

Referring to FIG. 1 shown is a material selection chart 100 for MEMS device implementations. Plotted onto the material selection chart are a range of different materials including metals, dielectrics, ceramics and polymers. Each material is represented by a point on the X-Y graph wherein the X-axis is density and Young's modulus is the Y-axis. The data is plotted according to the work of V. T. Srikar et al "Materials Selection in Micro-Mechanical Design: An Application of the Ashby Approach" (J. Microelectromechanical Systems Vol. 10, No. 1, pp. 3-10). As acoustic velocity, a factor governing the resonant frequency of structural materials, is determined in accordance with Equation 1 below, shown are lines of constant acoustic velocity 131, 132, 133 of $1\times10^3$ ms$^{-1}$, $3\times10^3$ ms$^{-1}$, and $1\times10^4$ ms$^{-1}$ respectively.

$$v = \sqrt{\frac{E}{\rho}}. \quad (1)$$

As is evident from the material selection chart different types of materials tend to be grouped together. Ceramic materials 140 tending to appear in the top left, metals 150 appear in the middle-right, whilst polymers and elastomers 120 are grouped together in the bottom-left. The trend arrow 110 indicates the direction of preference for selecting materials for MEMS application in having high Young's modulus and low density. Accordingly, from material selection chart 100 better alternatives to silicon (Si) are silicon carbide (SiC), alumina (Al2O3) or diamond (C). Of these three, SiC represents an interesting choice as the processing technology is relatively mature whilst offering an increased performance over silicon. Although great strides are being made in developing nano-crystalline diamond for microsystem design, see for example J. Wang et al "1.51 GHz Nano-Crystalline Diamond Micromechanical Disk Resonator with Material Mismatched Isolating Support" (IEEE 17$^{th}$ Annual Conf. on Micro Electro Mechanical Systems, 2004, pp. 641-644), the technology is still not widely available.

Figure 2:
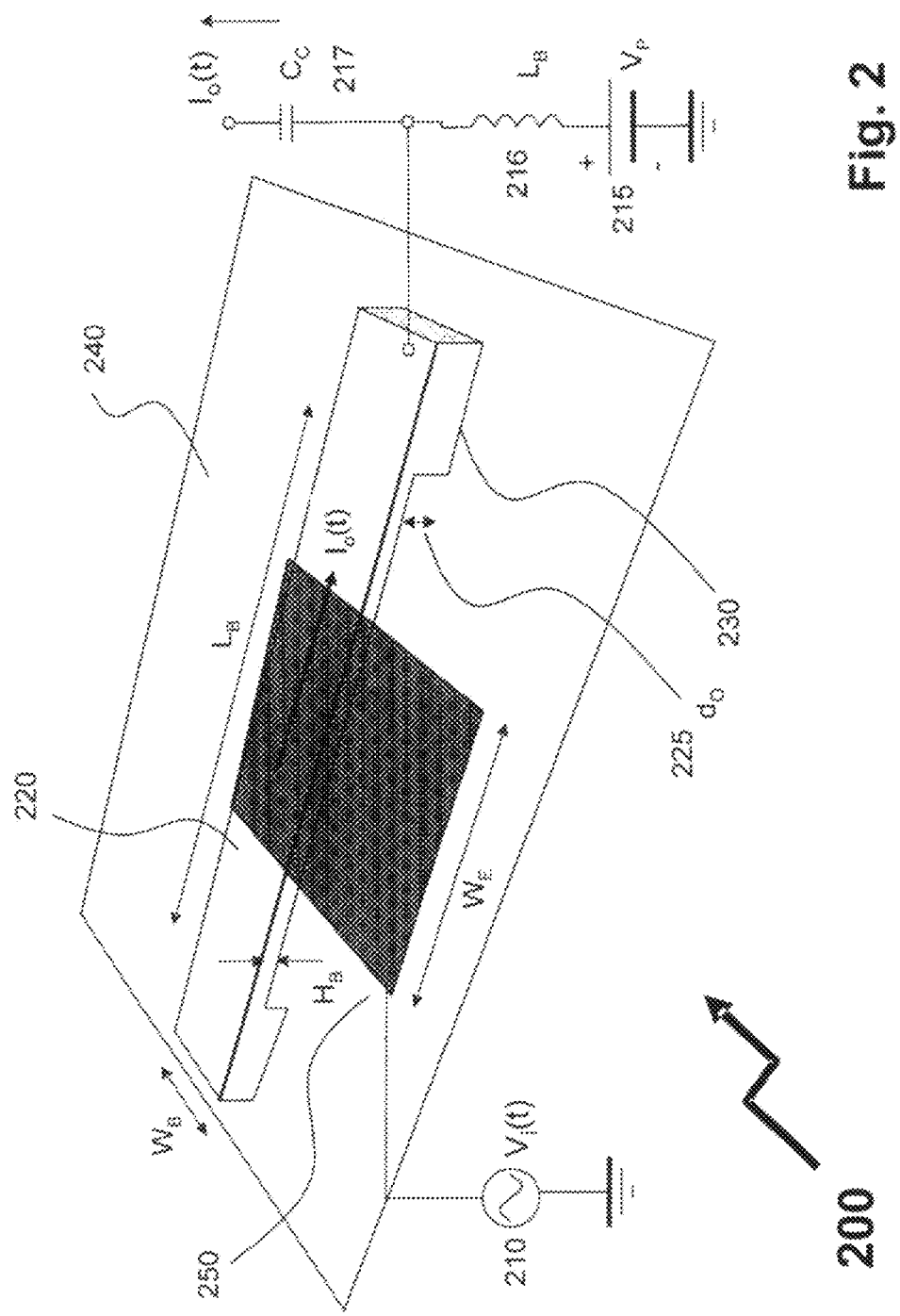
FIG. 2 illustrates a prior art embodiment of a clamped-clamped beam resonator.

Referring to FIG. 2 illustrated is prior art clamped-clamped beam resonator 200. Such a clamped-clamped beam resonator 200 when implemented in silicon potentially allows integration of the RF MEM resonators with CMOS electronics. As would be apparent to one skilled in the art such devices also place particular requirements on the electrical and mechanical performance requirements of MEMS processes and would particularly benefit from the integration of the RF MEM resonator directly with analog-digital CMOS electronics. For example, in wireless communications, micromechanical resonators are attractive components to use as intermediate frequency (IF) or image rejection filters and in frequency references. Current frequency references make use of quartz crystals, which cannot be integrated with CMOS and are associated with high costs. MEM resonators fabricated in accordance with an embodiment of the invention could replace these quartz crystals as resonant elements, and simultaneously enable a low-cost and fully-integrated solution via their implementation on silicon CMOS circuits.

As resonant devices, MEM resonators have a transmission characteristic that is tuned to a specific excitation frequency. In RF applications, these resonant structures are usually electro-statically actuated, and hence exhibit an electrical transfer function analogous to that of a highly selective band pass filter. As signal processors, these benefit from integration in communication systems where bulky and costly off-chip high-quality filters are replaceable by MEM resonators that are fully integrated to the underlying electronics. MEM resonators are also a significant enabling element of many sensing applications including, gas, vibration, ultrasound, chemical, and biological sensing. Biomedical applications extend into domains such as artificial cochlear implants. This large spread of applications makes resonators a critical building block candidate of any CMOS compatible MEMS process. MEM resonators are based on a structure's mechanical resonant modes and thus are intrinsically linked to the material properties of the MEMS structural materials, benefiting therefore from high Young's modulus and low density as outlined in respect of FIG. 1. Further, they are subject to few energy loss mechanisms that enable these devices to resonate with very high Q-factors.

The clamped-clamped beam resonator 200 is shown implemented onto a silicon substrate 240 to utilize the resonant electrical behavior of the clamped-clamped beam resonator 200. The resonant beam 220 is mounted by landings 230 having an electrode 250 positioned therebeneath. The clamped-clamped beam resonator 200 is based upon capacitive transduction. As such a signal input $v_i(t)$ from source 210 and a DC voltage $V_P$ 215 via inductor 216 are applied between the resonant beam 220 and the electrode 250. These bias and input voltages are effectively applied across a capacitor formed by the resonant beam 220 and the electrode 250 across the gap $d_o$ 225 creating an electrostatic force, which is balanced by the spring force of the beam. Once in resonance, the resonator sources an output current via capacitor 217 as described below in respect of Equation 2:

$$i_o \cong \frac{\varepsilon_o W_E W_B}{d_0^2} \frac{\delta x}{\delta t} V_P \qquad (2)$$

where x represents the resonator beam's 220 displacement, $\varepsilon_0$ the permittivity constant, $W_B$ the width of the beam, $W_E$ the width of the electrode 250, and $d_o$ the gap between the electrode 250 and lower surface of the resonant beam 220. As for the resonant frequency of the beam, it is defined by its shape and composition. In the case of a clamped-clamped beam resonator 200, neglecting the electrical spring force, the mechanical resonant frequency $f_o$ can be expressed as shown in Equation 3 as:

$$f_o = \frac{1}{2\pi}\sqrt{\frac{k_r}{m_r}} \cong 1.03 \sqrt{\frac{E}{\rho}} \frac{H_B}{L_B^2} \qquad (3)$$

where $H_B$ defines the beam thickness, $L_B$ the free beam length, E the beam's Young's modulus and $\rho$ it's density.

Figure 3:
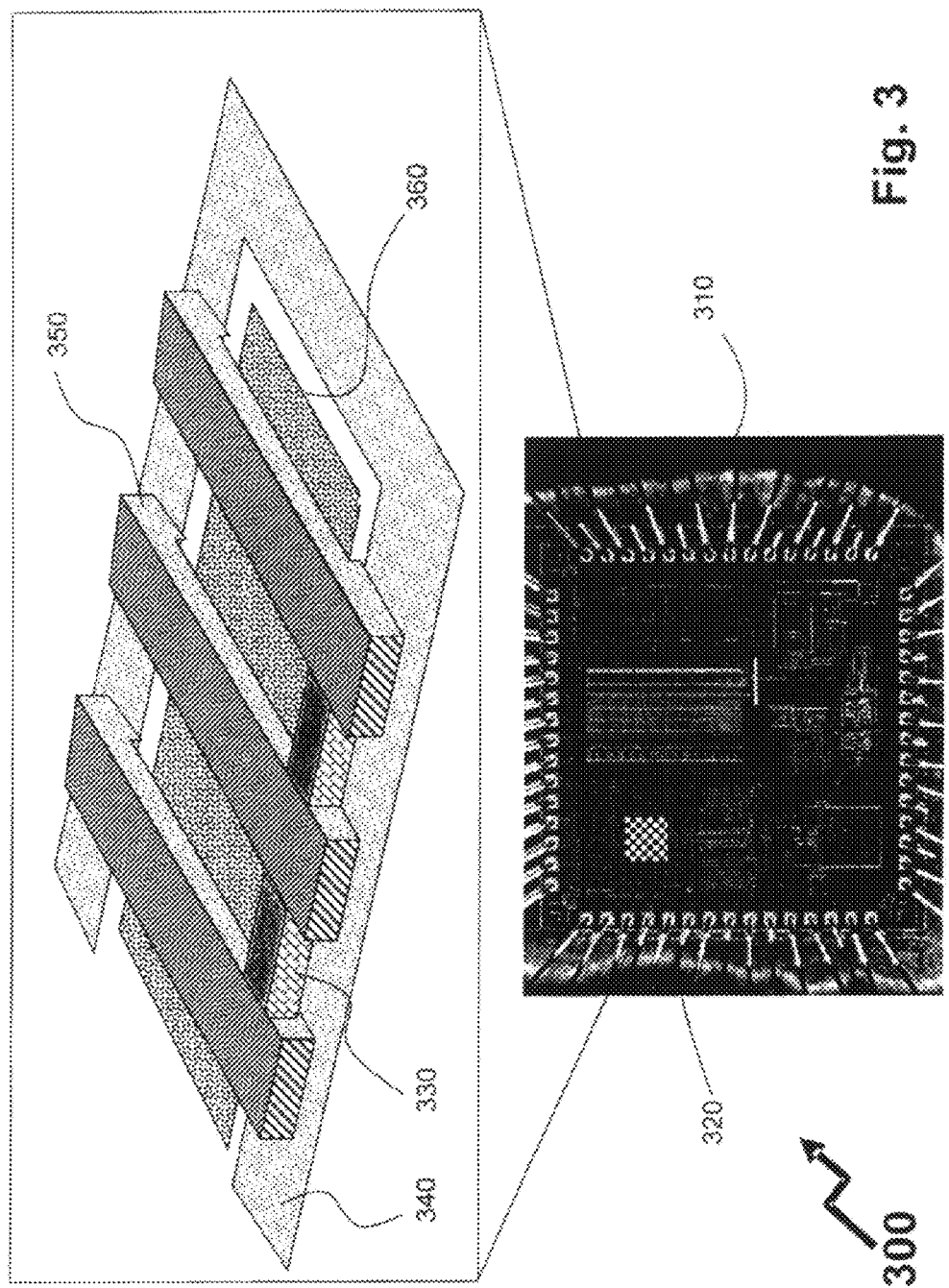
FIG. 3 illustrates a prior art silicon three beam resonator array with mechanical couplings.

It is possible to use the coupling of multiple resonators to reduce the effective motional resistance of a single resonator as is shown in a coupled multiple resonator array 320 in CMOS-MEMS assembly 300 of FIG. 3. As shown, the coupled multiple resonator array 320 has been assembled in a hybrid manner, such as with ultraviolet cured low out-gassing epoxy, low temperature wax, etc. onto a Si CMOS circuit 310. Such hybrid assembly used in the prior art due to the incompatibility of prior art Si MEMS processing with Si CMOS devices. As shown, formed within the Si micro-machined substrate are three MEM resonator elements 350, which are connected via connectors 330. The MEM resonator elements 350 are electrically connected to first electrical interconnect 340. The electrical signal is applied to second electrical interconnect 360.

If the input signal is distributed across many MEM resonator elements 350 electrically connected in parallel, the output current is higher, thus making the power handling of the overall array larger than that of a single resonator. The flexural beams 330 provide necessary flexural mechanical coupling for better matching the resonators' resonant frequencies. This approach unifies the resonant frequencies of the MEM resonator elements 350 and exhibits an overall increase in transmission at a single frequency, while reducing the effects of frequency mismatch between each of the MEM resonator elements 350 that arise from manufacturing and material variations.

Figure 4:
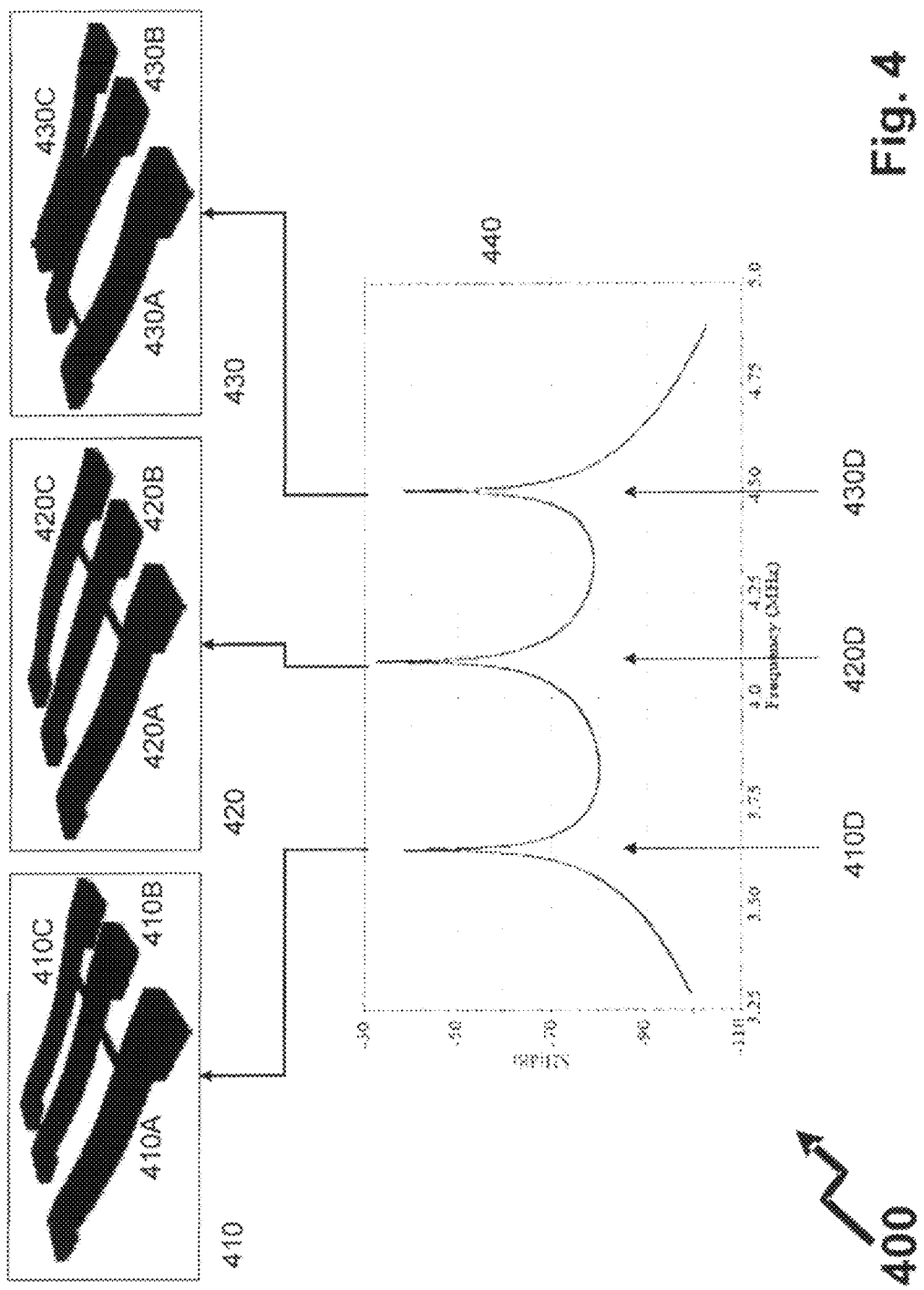
FIG. 4 illustrates resonant modes of operation for the three beam resonator array of FIG. 3.

FIG. 4 illustrates the resonant modes of operation for the three-beam resonator array 320 presented with reference to FIG. 3. As shown in response 400 the coupled multiple resonator array 320 operates in three modes 410, 420 and 430. In the first mode 410 with resonant frequency 410D motion of each of the three resonator elements 410A, 410B, and 410C are in phase. In the third mode 430 with resonant frequency 430D all three resonators 430A, 430B, 430C are in motion, but now the middle resonator 430B is out of phase with the edge resonators 430A and 430C.

The second mode 420 with resonant frequency 420D has central resonator 420B in static equilibrium due to the edge resonators' 420A and 420C having complementary displacements. In order for the coupled multiple resonator 320 to operate effectively as a filter, or oscillator, one of the modes of operation 410, 420, 430 is isolated so that the coupled multiple resonator 320 has a unique resonant frequency and, as such, behaves as a single lower motional resistance resonating structure. This mode isolation is achieved by electrically stimulating the resonators in such a way as to favor a particular resonant mode of the array. For example the coupled multiple resonator 320 is excited into the first mode 410 of operation by having the electrodes of the three resonators 410A, 410B, and 410C connected to an input signal with uniform phase across all resonators, similar to the structure shown in FIG. 3.

In resonator arrays like coupled multiple resonator array 320, the multiple operational modes are likely spaced away from each other in the frequency domain so that spurious modes lie well out of the band of interest for operation in a desired mode. This can be done through the use of high stiffness supports and coupling at high-velocity points such as connectors 330 of the coupled multiple resonator array 320. Alternatively half-wavelength supports, which have low mobility at the coupling point, are used to enhance the effective coupling stiffness of the supports.

It would be apparent that overall yield for such arrayed resonators such as coupled multiple resonator 320 is related to a combination of the manufacturing yield of the individual number of the MEM resonator elements 350 and the manufacturing tolerances of the processing of the MEM resonator elements 350 to align their resonant frequencies; these are scaled according to the number of MEM resonator elements 350. Accordingly, prior art coupled multiple resonator 320 designs exhibit low yield.

The clamped-clamped design, as employed for the each individual MEM resonator element 350, is achieved simply on the basis that the end-points of the beams are clamped by virtue of being fixed to the substrate. Alternatively, the MEM resonator element 350 is implemented using a free-free beam design such as shown in free-free designs 500A through 500C of FIG. 5. Considering the first free design 500A then shown is substrate 510A within which the side contact free beam 520A has been implemented. The side contact free beam 520A is anchored to the substrate 510A by side contacts 550A. Electrical connections comprise first interconnect 530A and coupled interconnect 540A.

Considering second free design 500B then shown is substrate 510B within which edge contact free beam 520B is implemented. The edge contact free beam 520B is anchored to the substrate 510B by edge contacts 550B. Electrical connections comprise first interconnect 530B and coupled interconnect 540B. In third free design 500C shown is substrate 510C within which center width free beam 520C is implemented. The center width free beam 520C is anchored to the substrate 510C by center width mounts 550C. Electrical connections comprise first interconnect 530C and coupled interconnect 540C.

The free-free designs 500A through 500C typically result in increased variations in resonant frequencies because of the finite nature of the anchor sizes, increased variability in these anchors from manufacturing, and material variations. If the size of the anchoring points is too big, the beams will tend to behave as a clamped-clamped beam. Edge support which uses torsional supports is least intrusive on Q-factor and on resonant frequency because of its indirect constraint on the nodal points without direct substrate contact. It is however more difficult to fabricate because of the thin electrical support interconnect requiring fine resolution. Accordingly, whilst free-free designs offer designers an increased Q-factor, their reduced yield from prior art designs has resulted in these being more costly through reduced yield.

Accordingly, it would be beneficial to provide a means of tuning either the clamped-clamped resonator design, such as MEM resonator element 350, or the free-free resonator design, exemplified by free-free designs 500A through 500C, post-fabrication. Such post-fabrication tuning provides both increased yield and reduced cost to a specific target frequency but also provides additional design flexibility of tuning the resonators according to a characteristic of the signals being coupled to and from it by the excitation electrodes, such as second electrical interconnect 360 or coupled interconnects 540A through 540C.

Figure 5:
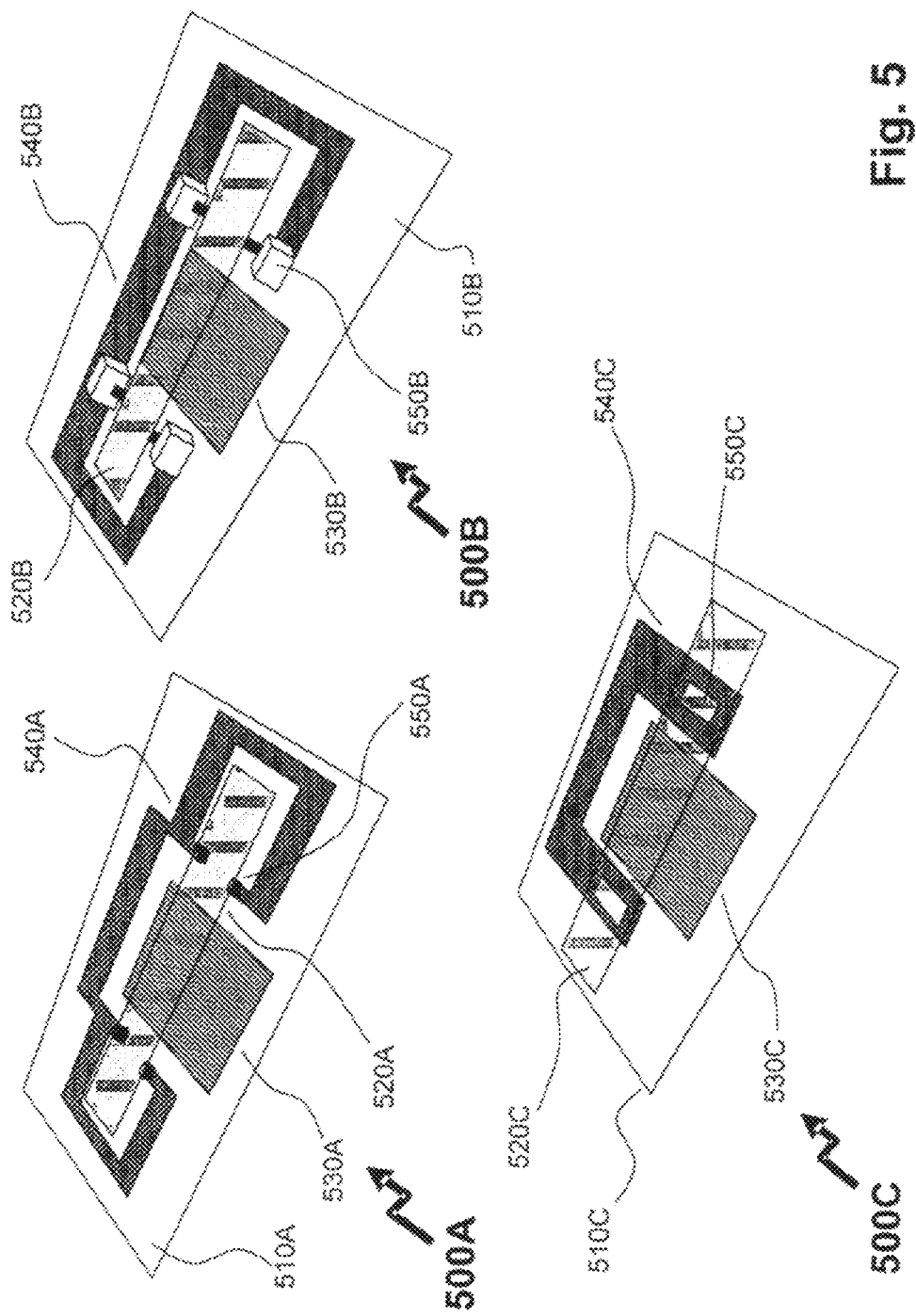
FIG. 5 illustrates three designs of free-free beam resonators implemented according to embodiments of the invention.

Prior art MEM resonators are tunable to some degree by adjusting the DC bias voltage across the gap capacitance, such as between first and second electrical interconnects 340 and 350 of FIG. 3 and first interconnect 530A and coupled interconnect 540A of first free design 500A of FIG. 5. A positive increase in the bias voltage applied between these electrodes is accompanied by a decrease in the resonant frequency of the MEM resonator. This effect, commonly referred to as "spring softening", allows the output frequency of the MEM resonator to be tuned. A significant drawback is that the resonant frequency will also change as the input signal amplitude grows beyond the small-signal regime, which has a significant effect on the short-term frequency stability of the resonator. Further, the dependence on the insertion loss of the resonator with voltage makes this method impractical in applications that require constant insertion loss over the tuning range. Additionally, as spring softening is a non-linear effect, device linearity is deteriorated as bias voltage is increased. This can make linearity of a device for a certain frequency tuning non-satisfactory to a particular application.

Figure 6A:
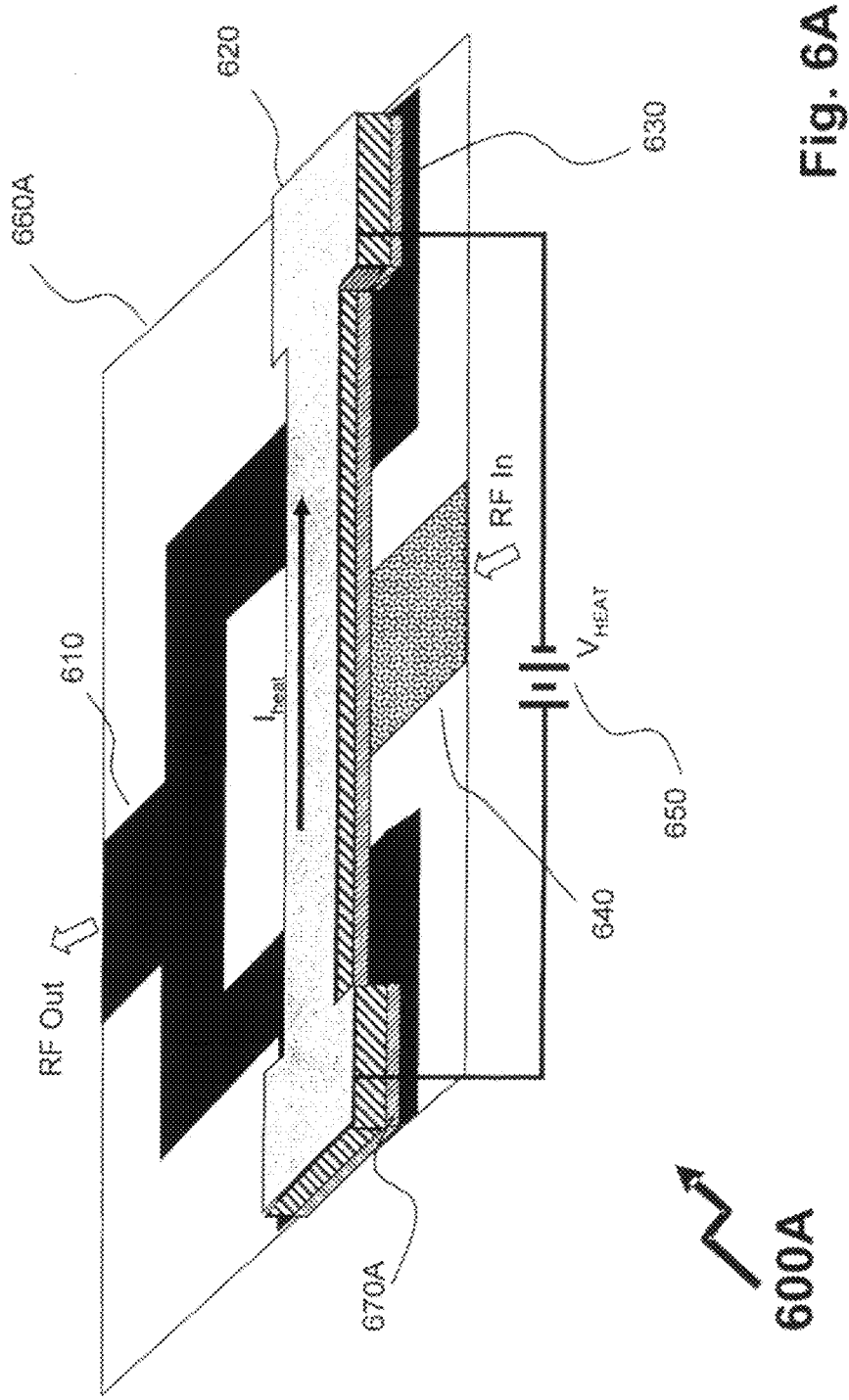
FIG. 6A illustrates a clamped-clamped beam resonator according to an embodiment of the invention with thermal tuning to the upper side of the resonator beam.

According to an embodiment of the invention there is provided a thermal component for thermally tuning the resonant frequency of the MEM resonator without using the signal contacts. Such a novel MEM resonator is shown in FIG. 6A as thermally tuned resonator 600A. The thermally tuned resonator 600A comprises a clamped-clamped beam 630 on the silicon substrate 660A, with RF input signal electrode 640 and RF output signal electrode 610. However, unlike prior art MEM resonators, the clamped-clamped beam 630 is formed from non-conductive ceramic, such as SiC, and allows metallization to be formed on an upper surface, upper contact 620, that does not conduct to the lower metallization 670A of RF output signal electrode 610 that connects to the clamped ends of the clamped-clamped beam 630.

Figure 6B:
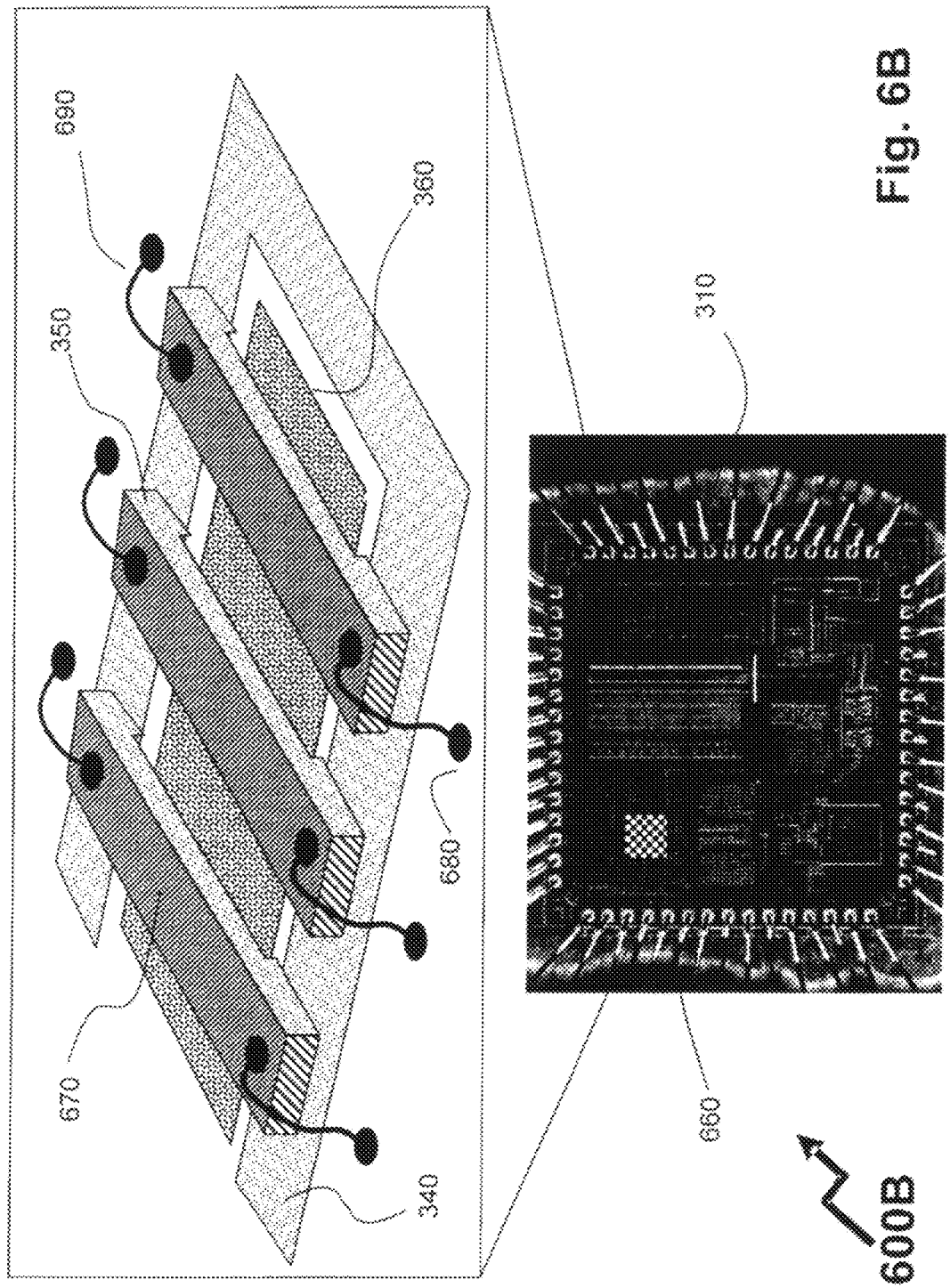
FIG. 6B illustrates an arrayed three beam resonator with couplings according to an embodiment of the invention.

Therefore, providing an electrical connection to either end of the upper contact 620 via a DC voltage source, $V_{HEAT}$, 650, results in DC current, $I_{HEAT}$, heating up the beam. The heating allows tuning of the resonant frequency through temperature dependent material properties of the clamped-clamped beam 630. Further referring to FIG. 6B shown is a thermally tuned resonator array 660 formed onto a Si CMOS circuit 310 in CMOS-MEMS chip 600B. The thermally tuned resonator array 660 is optionally directly manufactured onto the Si CMOS circuit as the thermal processing cycles of the thermally tuned resonator array 660 are optionally compatible with maximum temperature budgets of the Si CMOS circuit 310.

Here, the thermally tuned resonator array 660 comprises MEM resonator elements 350 of a clamped-clamped design electrically connected to the first electrical interconnect 340 and excited via the second electrical interconnect 360 as presented supra in respect of FIG. 3. However, each MEM resonator element 350 now has an upper metallization 670 which is electrically connected from source track (not shown for clarity) via source bond wire 680 at one end and to sink track (not shown for clarity) via sink bond wire 690 at the other end. In this manner each of the MEM resonator elements 350 is individually electrically controlled directly from control circuitry implemented within the Si CMOS circuit 310, and is done so independently from the resonator bias voltage.

As described hereinbelow, for a MEMS compatible process onto a Si CMOS device an important aspect relates to the method of forming the structural material of the MEMS devices based upon consideration of
    intrinsic stress control for low stress films to prevent structural bulking or fracture,
    ability to form small gaps ($d_o$<200 nm) to allow for effective electrostatic coupling,
    CMOS-compatible deposition temperature, and
    low-cost deposition technology that allows for manufacturability.

Based upon material selection chart 100, it is evident that SiC, $Al_2O_3$ (alumina), diamond, and potentially $Si_3N_4$ (silicon nitride) offer enhanced MEMS performance to prior art silicon. In considering SiC as an example, a critical aspect of the implementation of MEM devices is the deposition of the core structural SiC layers. Within the prior art SiC has been traditionally deposited using one of four different methods:
    1) low-pressure chemical vapor deposition (LPCVD);
    2) atmospheric pressure chemical vapor deposition (APCVD);
    3) plasma-enhanced chemical vapor deposition (PECVD); and
    4) magnetron enhanced sputtering.

Both LPCVD and APCVD have been used to successfully deposit SiC films; however, these reactions are usually highly endothermic and yield poor stress control, and hence require temperatures typically of 800° C. to 1300° C. As a require of these high temperatures, no method to date has allowed for post-CMOS integration using APCVD or LPCVD of SiC. Furthermore, the deposition rate is typically very low since the overall reaction is limited by the surface reaction rate.

PECVD which uses an RF-induced plasma to transfer energy to the reactant gases allows the substrate to remain at a much lower temperature. Using this technique, low temperature deposition is possible. The composition of SiC deposited at these relatively low temperatures is amorphous or polycrystalline with crystal grains present in more quantity when the deposition temperature is increased. Residual stresses in deposited films, however, are typically very high, and therefore a CMOS incompatible post-deposition high temperature anneal is used.

For SiC deposition to provide structural layers in MEMS by exploiting DC magnetron enhanced sputtering not only can the processing be performed at room temperature, but the process yields good stress control without requiring special CVD processes. DC sputtering is also usable for metal depositions for upper and lower metallizations to the ceramic layer resulting in a significant reduction in the amount and cost of equipment needed to implement the process. This renders the process disclosed herein less hardware dependant for enhanced manufacturability. Sputtering is typically performed by bombarding a SiC target with positive argon ions created in a plasma. These incident ions sputter away material by physical momentum transfer, which then condenses onto the substrate. Since this is a purely physical process, no external heat source is required and the process is optionally performed at room temperature; however, the substrate temperature rises due to bombardment by secondary electrons, and neutral atoms. According to an embodiment a maximum temperature of the substrate is limited to below 400 degrees Celsius and more preferably to below 350 degrees Celsius or even 250 degrees Celsius, which is considerably lower that most CVD processes. These maximum temperatures can be reduced further at the cost of lower throughput when thermal relief pauses are taken during deposition. Another advantage of physical sputtering is that deposited films are conformal and adhere well to the substrate. The puttering process has a relatively high deposition rate, and residual stresses are addressable by careful selection of the process parameters.

Further, some embodiments provide for a low temperature MEMS structural deposition process that is relatively simple, low-cost, and can be performed using only argon gas and a sintered SiC target. Beneficially the SiC from the process is amorphous, has isotropic material properties, maintains its high elastic modulus, hardness and inertness but is non-conductive thereby allowing the isolation of electrical contacts on one surface or between top and bottom surfaces as discussed hereinabove. The interconnects are metal-based in order to maintain low thermal loading to the Si CMOS circuits. This has an added benefit of lower resistance interconnects, as metal conductivities are orders of magnitude better than doped semiconductors. Further, it achieves low resistive energy losses that improve Q-factor performance of devices such as MEM resonators. Alternatively, with reduced thermal constraints doping is employed to provide interconnects to the SiC structural elements.

Figure 7A:
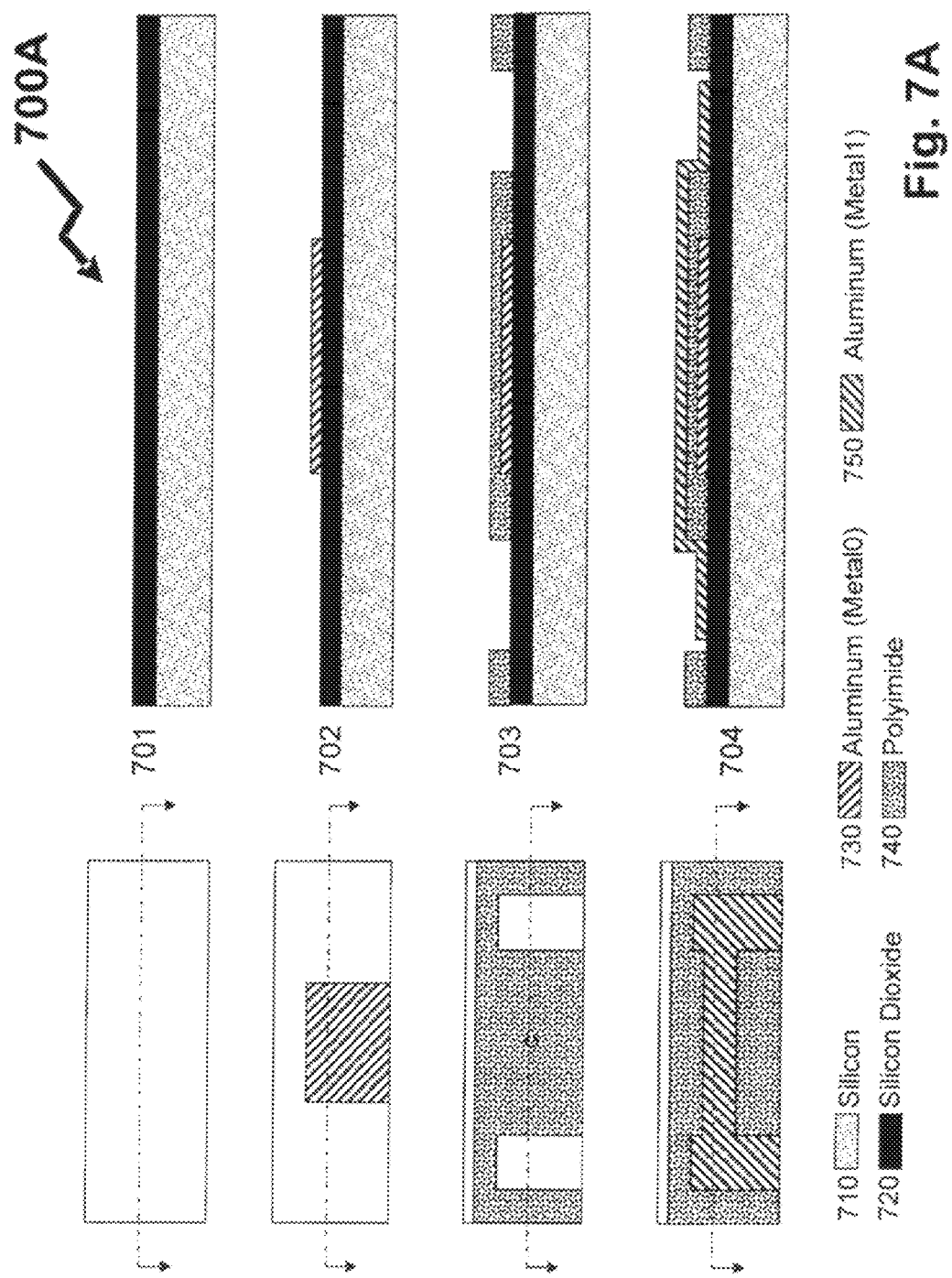
FIGS. 7A, 7B, and 7C illustrate an embodiment of the invention in respect of a process flow to providing MEMS SiC on Si CMOS.
Figure 7B:
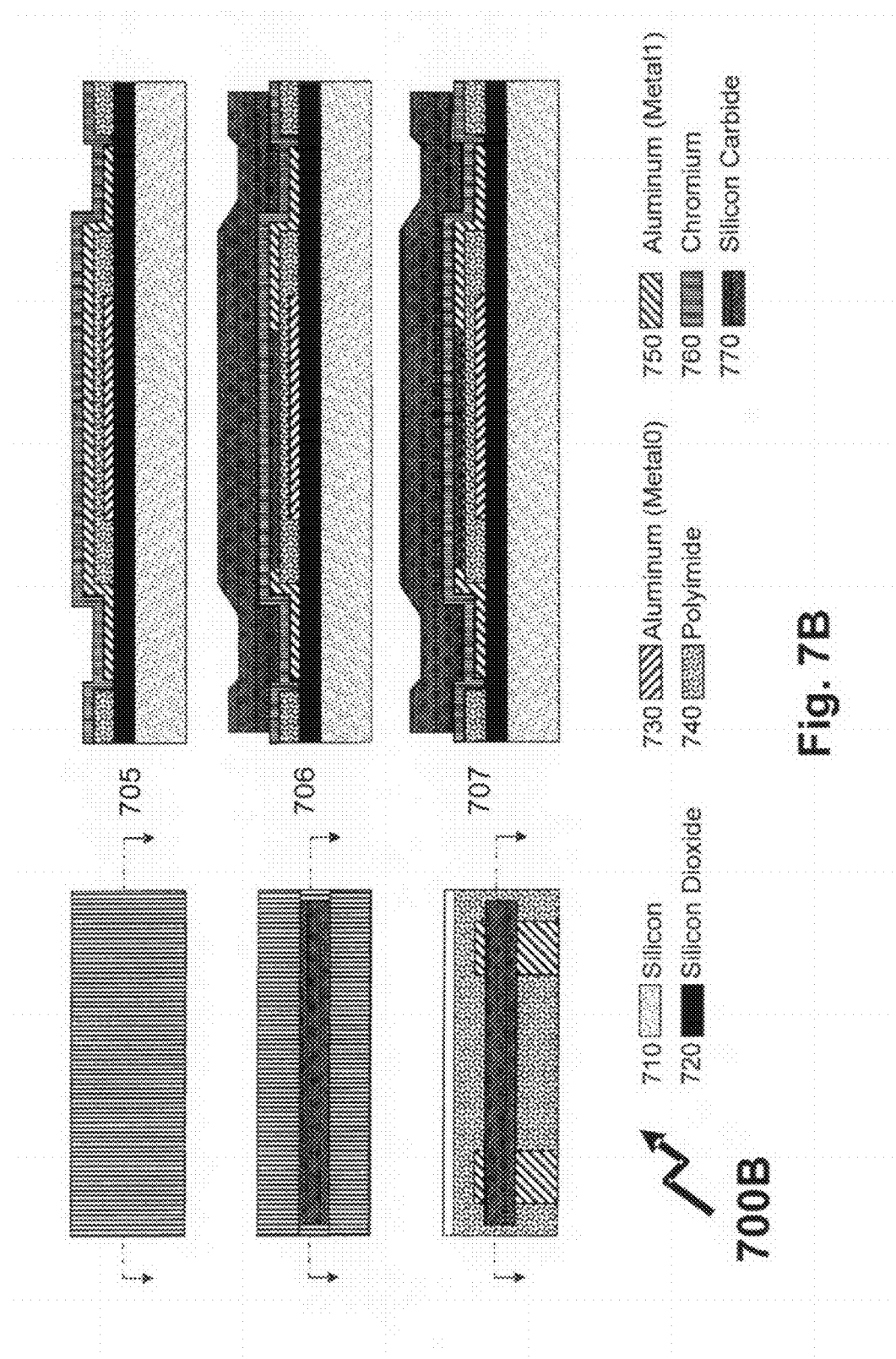
Figure 7C:
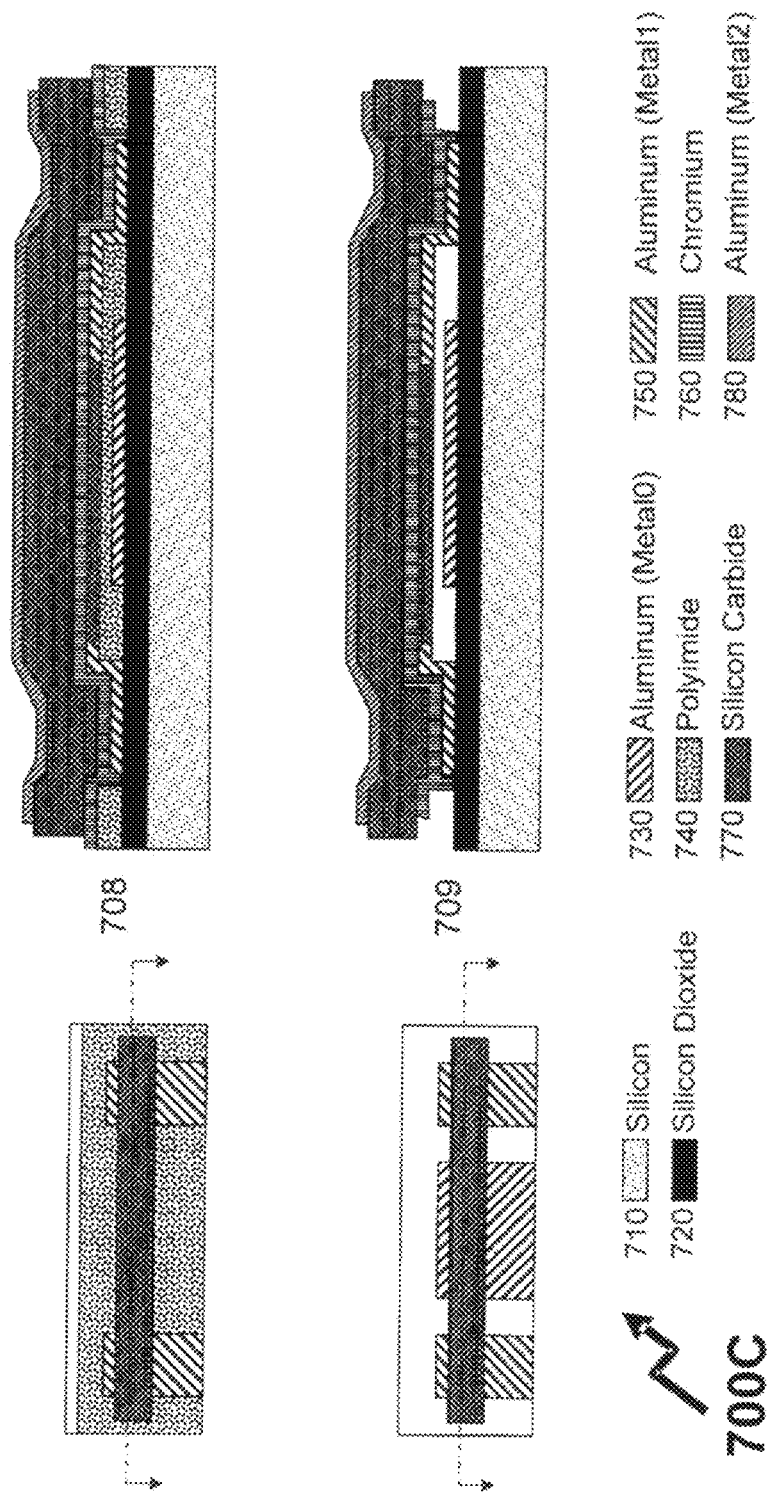

Accordingly, a manufacturing process flow is presented in respect of FIGS. 7A, 7B and 7C illustrating an embodiment for providing a MEMS SiC directly integrated onto Si CMOS allowing the provisioning of thermal tuning electrodes on the upper surface of the SiC structural layer electrically isolated from electrical interconnects on the surface of the Si CMOS and lower SiC surface. Referring to FIG. 7A, initial process results are shown in plan and cross-sectional views 700A. At 701 a silicon wafer 710 is coated with a 2.5 μm layer of silicon dioxide 720 to reduce electrical feed-through from electrical interconnects of the MEMS structure to the Si CMOS circuits within the silicon wafer 710. At 702 interconnect/ground metallization is formed onto the upper surface of the 2.5 μm layer of silicon dioxide 720 by depositing 60 nm of aluminum (Metal 0) 730 and wet etching to form an electrical pattern as specified.

Next at 703 a 0.2 μm polyimide layer 740 is deposited and patterned with oxygen reactive ion etching. The 0.2 μm polyimide layer 740 is sacrificial to release the MEM resonator as finally formed. On top of the sacrificial polyimide layer 740 60 nm aluminum layer (metal 1) 750 is deposited and patterned at 704. The 60 nm aluminum layer (metal 1) 750 forms a lower side metallization of the MEMS structure, in this case the beam interconnect layer.

Now referring to FIG. 7B, the intermediate process results are shown in plan and cross-sectional views 700B. At 705 an 80 nm SiC etch-stop blanket layer of chromium layer 760 is deposited across the surface of the wafer. Next at 706 a 2 μm SiC MEMS structural layer 570 is deposited and patterned using reactive ion etching in, for example, a $NF_3$ environment. At this point an aluminum layer for pad creation or interconnect resistance reduction is optionally patterned. At 707 the exposed chromium layer 760 is etched using a conventional wet etchant.

Now referring to FIG. 7C, final process results are shown in plan and cross-sectional views 700C. At 708 a further aluminum layer (metal 2) 780 is deposited and patterned onto the upper surface of the SiC MEMS structural layer 760. This aluminum layer (metal 2) 780 allows formation of upper metallization 670 to provide heater elements to thermally tuned MEMS devices. Due to the non-conductive nature of the SiC MEMS structural layer 760, the aluminum layer (metal 2) 780 is electrically isolated from both the aluminum layer (metal 1) 750 and aluminum layer (metal 0) 730.

Finally at 709 the polyimide sacrificial layer 740 is removed from the wafer using a dry oxygen plasma process. The result in the embodiment described is to release the beam of the MEM resonator. The release etch also removes any remaining exposed chromium layer 760 from under the SiC MEMS structural layer 770 where no aluminum layer (metal 1) 750 is patterned.

It will be evident that the exemplary embodiment presented in respect of FIGS. 7A, 7B, and 7C provides for three metal layers for routing signal and actuation voltages, one being the aluminum (metal 0) 730 direct to the Si CMOS substrate surface, the second being aluminum (metal 1) 750 on the underside of the SiC MEMS structural layer 570, and the third being the aluminum (metal 2) 780 layer formed onto the upper surface of the SiC MEMS structural layer 770. Optionally, more or fewer metal layers are provided.

The embodiment presented in respect of FIGS. 7A, 7B, and 7C is a MEM resonator and is just one possible application of the process described hereinabove where flexibility of three metal layers and SiC MEMS structural layer exist. Optionally the aluminum is replaced with tungsten or other electrical interconnect materials in dependence upon the environmental and chemical aspects of the environment within which the MEMS device is intended to operate and in dependence upon specifics of a manufacturing process employed. Alternatively the silicon dioxide layer 720 is removed when applied directly onto a processed CMOS substrate's passivation or planarization layer. Such layers are typically phosphosilicate glass, silicon oxide, or silicon nitride.

Providing electrical interconnections and structures on both the lower and upper sides of the MEMS structural layer is useful in providing a heating element but is also useful in providing for other applications and routing. Optionally the approach benefits any non-conductive structural layer. Alternatively, the lower metallization—structural layer—upper metallization structure is expanded to other combinations and multiple repetitions of the sandwich structure are provided without exceeding upper temperature limits of the Si CMOS compatible process. Accordingly, the flexibility to provide full metal—structural layer—metal sandwich structures together with partial variants of lower metal—structural layer and structural layer—upper metal, allowing the full scope of the Si CMOS compatible MEMS process to be exploited in supporting manufacture of a plurality of different MEMS devices including but not limited to RF switches with signal isolation, tunable inductors, tunable capacitors, RF resonators and tuned RF resonators.

In the following sections aspects of the exemplary embodiments are discussed in respect of aspects of the SiC MEMS layer.

Deposition:

The SiC MEMS structural layer 770 was deposited in experiments with low intrinsic stress using DC magnetron enhanced sputtering at a range of powers from 300 W to 2000 W and under varying chamber pressures of 3 mTorr to 25 mTorr. An experimental deposition process, resulting film thickness, and resultant film stress are outlined below in respect of Table 1. Other deposition regimes for DC magnetron sputtering are usable without departing from the scope of the invention for low temperature deposition of SiC. Typical deposition rates are 75 nm/min from the DC magnetron conditions. Optionally, other deposition techniques are employed provided their maximum substrate temperature does not exceed a maximum temperature specified, for example 400° C., and preferably 300° C.

TABLE 1

Exemplary Deposition Process for SiC Structural Layer

| Process Parameter | Value |
|---|---|
| Power (kW) | 2 |
| Pressure (mTorr) | 6 |
| Scan Speed (cm/min) | 5 |
| Scans | 9 |
| Tensile Stress (MPa) | 20 |
| Thickness (μm) | 2 |

Etching:

In general, patterning of SiC MEMS structural layer 770 is much more difficult than other commonly used semi-conducting materials because of its low reactivity. Due to the strong inter-atomic bond of the silicon and carbon atoms (1.34 times stronger than a Si—Si bond), etching using aqueous solutions is typically performed at temperatures greater than 600° C., which makes wet etching impractical for a low-temperature process. As a result, patterning for the SiC MEMS structural layer 770 is undertaken using, for example, dry processing techniques such as reactive-ion-etching and lift-off. Using lift-off is an attractive method since it can be used to pattern any type of material. In this technique, SiC is first non-conformally deposited over a high-aspect ratio pre-formed mold. Next, the temporary mold is then removed using a wet etch, which lifts-off the unwanted SiC and leaves the patterned structure behind. Even though this method yields good results, it is still quite involved and necessitates the use of multiple steps and sacrificial materials. Of course, wet processes that are operable below a specified maximum temperature may be used when applicable.

Dry plasma based techniques such as reactive ion etching (RIE) provide a simple technique to pattern a SiC MEMS structural layer 770. The rate of the overall etch process is dependant on many factors which include pressure, RF power, gas flow rate, DC bias, cathode temperature, and gas chemistry. These parameters are tunable to obtain highly anisotropic etch profiles for SiC and in order to sustain high etch rates, >2000 Å/min. To increase the etch rate further, the RIE chamber is optionally magnetically enhanced (ME).

Mask:

In order to etch the SiC MEMS structural layer a mask is provided onto an upper surface thereof. Since the etch specified in the example within the RIE is $NH_3$ based the lower tendency of chromium to form involatile etch products with fluorine has been exploited in establishing a two-layer metallic mask for the etching of the SiC MEMS structural layer. As shown in FIG. 7D, a masking structure 7000 is formed after the SiC structural layer 770 and comprises a 2000 Å layer of aluminum 790 which is followed by a 5000 Å layer of chromium 795. According to an embodiment the chromium 795 is first patterned with a conventional wet-etch, for example Cyantek Cr-14, which then forms the RIE etch mask for the SiC MEMS structural layer. The structure is then wet etched using Phosphoric-Acetic-Nitric acids (PAN), which does not attack chromium 795 but etches away the aluminum 790. By timing this process appropriately, the aluminum is over-etched to provide a slight undercut 799 beneath the chromium 795, preventing aluminum 790 sputtering during the RIE etch, and thereby improving the sidewall quality while still yielding an aluminum top metallization.

The masking process described hereinabove for masking SiC exploits chromium to reduce a micro-masking effect, and thus reduces post-etch residue. Alternatively, an aluminum top conductive layer alone is employed as mask where such micro-masking effects are not critical limits to the MEMS performance. The bi-layer mask of chromium and aluminum to pattern the SiC allows low temperature MEMS process to mitigate micro-masking effects whilst patterning both the SiC and the top interconnect in one process step. The bi-layer mask of chromium-aluminum is optionally replaced with any two metal material combination to create the top electrical interconnect and etch the structural layer, provided it meets the requirements of deposition temperature, process compatibility, etch resilience, etch rate and etch quality. It would be apparent to one skilled in the art that the bi-layer mask provides enhanced cost benefits in a low temperature Si CMOS compatible MEMS process.

Etch Stop:

For increased manufacturability, etching of thick, inert SiC MEMS structural layers is improved through inclusion of an etch-stop into the mechanical stack of materials of the process structure. Table 2 below presents etch rates under typical RIE process parameters for material discussed with respect to the above embodiments, namely SiC 770, aluminum 790, and chromium 795.

TABLE 2

Etching Process and Etch Rates for Key Materials

| Process Parameter | Value |
|---|---|
| Etch Gas | $NF_3$ |
| Gas Flow Rate (sccm) | 15 |
| RF Power (W) | 400 |
| Pressure (mTorr) | 6 |
| Magnetic Field (G) | 65 |
| SiC Etch Rate (Å/min) | ~2075 |

TABLE 2-continued

Etching Process and Etch Rates for Key Materials

| Process Parameter | Value |
|---|---|
| Al Etch Rate (Å/min) | ~425 |
| Cr Etch Rate (Å/min) | ~200 |

Accordingly, 800 Å is typical of the etch stop employed as chromium layer 760 within FIG. 7B. One of the main difficulties when using SiC, is the lack of a robust etch stop in most processes; for example, the etch rate of SiC when using RIE is usually about the same order of magnitude as for silicon oxide, silicon nitride and poly-silicon. Thus, the etch rate must be tightly controlled in order to prevent damage to underlying layers. This allows a more uniform and repeatable etch, and the protection of the underlying sacrificial layer and bottom interconnect layer to subsequent etches. Also, it allows for a subsequent release of free elements of the MEMS without polyimide fluorination problems caused by the $NF_3$ SiC etch.

Sacrificial Layer:

A sacrificial material is used to create the gap between the SiC MEMS structural layer and actuation electrodes or structures on a for example Si CMOS substrate. Since different types of RF MEM devices have different topologies, the thickness of this layer is adjustable; for example, RF MEM resonators such as clamped-clamped beam resonator 200 of FIG. 2 include a tightly-controlled thin gap on the order of 100 nm ($d_o$=100 nm), while inductors such as a MEMS-CMOS inductor typically include a large gap ($d_o$>5 μm) to reduce coupling to the substrate. Thus, a deposition rate is accurately controlled while still being relatively large to reduce processing time. Secondly, this layer is preferably easily removed using isotropic etching techniques that do not adversely affect other materials in the device. Wet etchants are commonly used to release most MEMS devices as they are cost effective and multiple wafers can be batch processed.

However, a main drawback of wet etching the sacrificial layer is that capillary forces can pull free-standing structures down to the substrate after the wafer is dried. This effect, called stiction, can render a large portion of devices inoperable. Therefore, a more attractive release method is to use a dry plasma based etch. Since the etch takes place in a vacuum, no special rinsing and drying procedures to prevent stiction are required after release. In both cases, however, the release step is preferably highly selective to the sacrificial material and thus, in the examples above, should not etch either aluminum or silicon carbide. SiC does not etch easily in aqueous solutions and is relatively inert, however, aluminum is readily etched by many commonly used release etchants such has hydrofluoric acid (HF). Also, since this process is intended for integration with CMOS, ideally the etchant is 'oxide compatible' to ensure that the underlying electronics are not damaged by the release process. As such the etchant preferably does not attack common CMOS passivation or planarization layers such as phosphosilicate glass, silicon oxide, silicon nitride, or silicon oxynitride when the process is used with a CMOS circuit.

For embodiments of the invention described hereinabove the sacrificial layer is polyimide. Polyimides are special types of polymers that have both excellent chemical resistance and thermal stability usually deposited in a spin coating process. The initial solution is composed of a high-molecular weight, polyamic acid precursor dissolved in an N-methyl-2-pyrrolidone (NMP) solvent system. The spun film is then cured at elevated temperatures, which evaporates any remaining solvent and converts the polyamic acid into its insoluble and highly chemically resistant form. After imidization is complete, these films are mechanically tough and withstand a number of common solvents and acids, including acetone, isopropyl alcohol, PAN, and CR-14. Thus, this material is suitable for the process described, which contains both aluminum and chromium layers. Alternatively, another material is used as the sacrificial material.

When used as a sacrificial material, polyimide has many advantages. First, since it is deposited in a spin coating process, the deposition temperature is only limited by the curing step, which is optionally as low as 200° C. This makes it suitable for a low-temperature, CMOS-compatible MEMS fabrication processes. Second, polyimide films are readily etched in oxygen plasma and thus, devices can be released in a completely dry process which eliminates complex drying procedures. Lastly, the thickness of the layer is controllably adjustable from a few microns all the way down to 100 nm by diluting with an appropriate solvent and by changing the spin speed. This allows for great design flexibility in respect of the different types of RF MEMS devices requiring different gap sizes while maintaining the simplicity of being removed using thy oxygen plasma etching.

Whilst the embodiments described hereinabove with respect to low temperature CMOS compatible MEMS process have been described with respect to one materials system, SiC and metallization it the process relates to other materials systems.

Whilst the embodiments are described with respect to DC magnetron sputtering of SiC, optionally the SiC is deposited by another sputtering process providing low maximum substrate temperatures. Optionally, SiC is replaced by another ceramic structural layer, for example one or more of silicon, silicon dioxide, and silicon nitride. Similarly whilst the electrical interconnections have been described in respect of aluminum, alternatively other metallization is implemented according to the specifications of conductivity, resistance, environment, chemical resilience etc. Optionally alternative metallization includes, but is not limited to, gold, titanium, tungsten, silver, copper, and alloys thereof.

The sacrificial material whilst described as polyimide is alternatively another material. When used with a low temperature manufacturing process, the other material is suited to low-temperature processing, for example spin-on or sputtered deposition techniques with appropriate sacrificial layer processing and ability to form the MEMS in respect of the thinness of the gap. Alternative sacrificial materials including but not limited to include sputtered chromium, silicon, silicon dioxide, indium tin oxide (ITO), spin-on glasses, PMNA or any organic compounds could be used in the process at low temperatures.

Figure 8A:
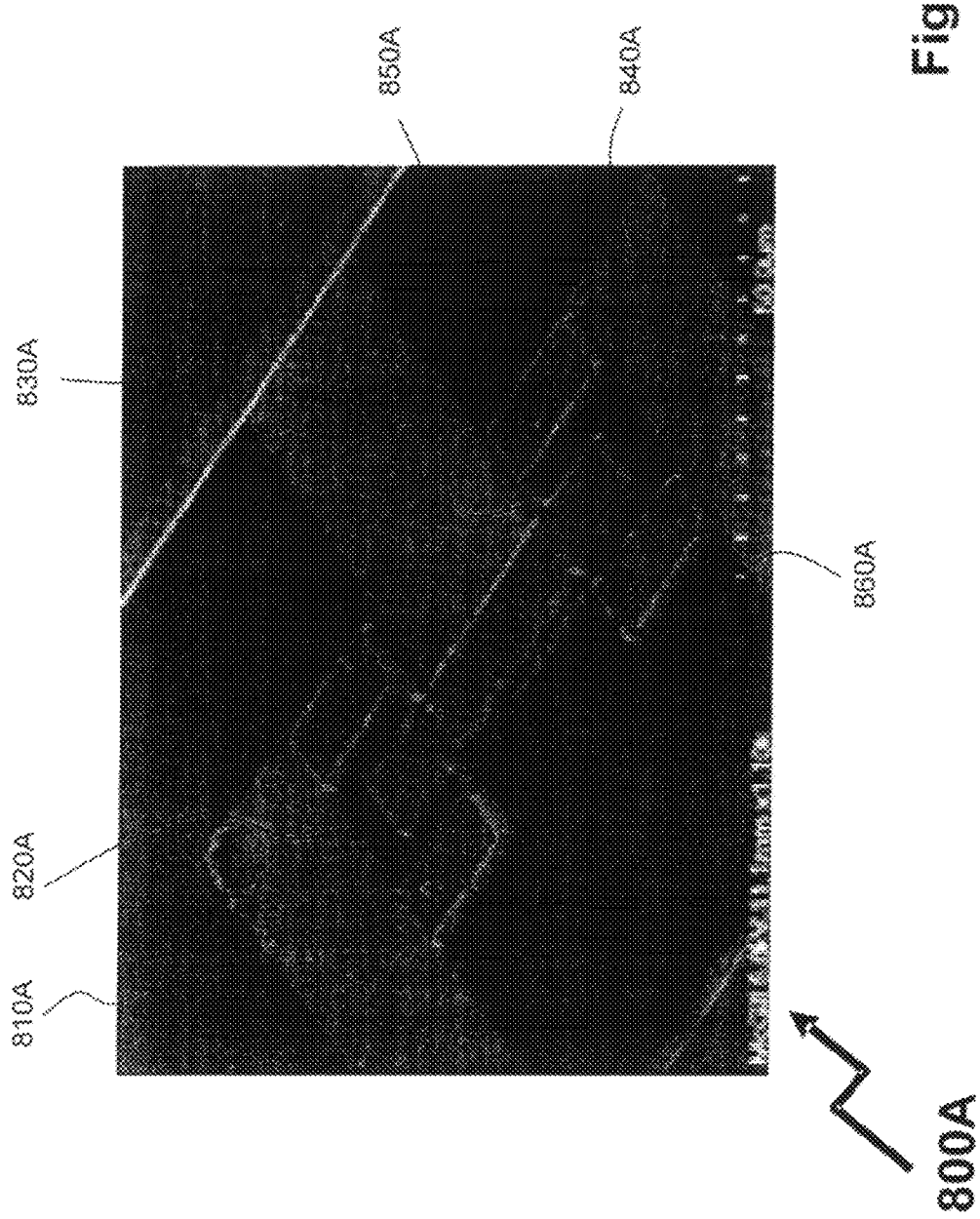
FIG. 8A shows a photograph of a free-free beam resonator according to an embodiment of the invention with a 200 nm resonator gap.

Referring to FIG. 8A, shown is a photomicrograph of a fabricated SiC MEM resonator 800A with a Si CMOS compatible process according to FIGS. 7A through 7C. The SiC MEM resonator 800 is of a first free-free design 500A and having substrate 810A upon which the side contact free beam 820A is implemented. The side contact free beam 820A is supported by side contacts 850A and anchored to the substrate 810A by anchors 860A. Electrical connections comprise first interconnect 830A and coupled interconnect 840A.

Figure 8B:
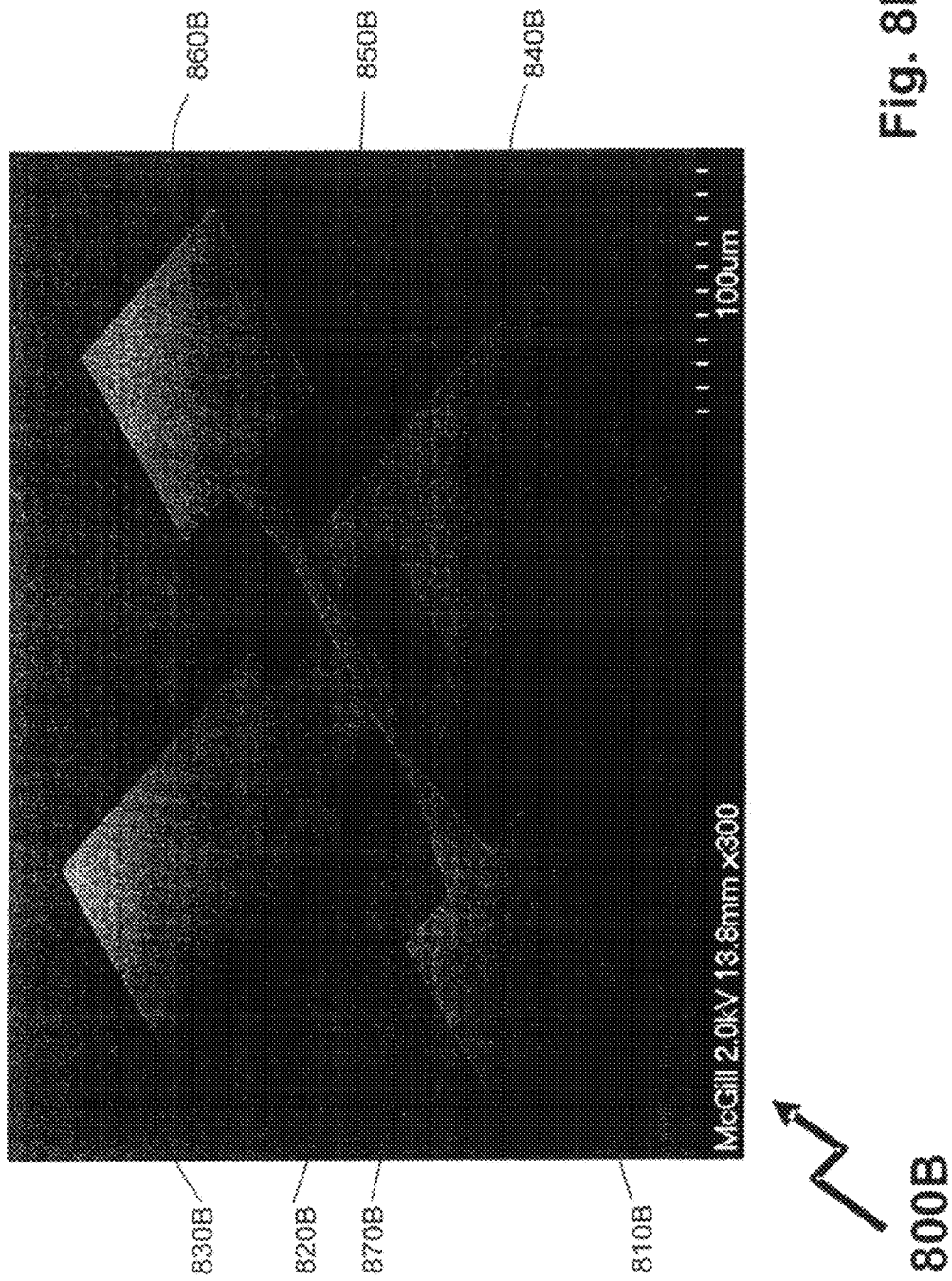
FIG. 8B shows a photograph of a clamped-clamped beam resonator according to an embodiment of the invention.

Referring to FIG. 8B, shown is a photomicrograph of a fabricated embodiment of a SiC MEM resonator 800B with a Si CMOS compatible process as described in respect of FIGS. 7A through 7C. The SiC MEM resonator 800 is a clamped-clamped design having substrate 810B onto which the free resonator beam 820B is implemented. The free resonator beam 820B, and is supported by end supports 850B which connect to landing pads 860B. Electrical connections for the SiC MEM resonator 800B comprise first interconnect 830B and coupled interconnect 840B.

The clamped-clamped resonator beam 820B, according to an embodiment, is non-conductive and accordingly a heater 870B is implemented onto the upper surface of the resonator beam 820B. This heater 870B is electrically isolated from the first interconnect 830B and coupled interconnect 840B. Electrical interconnections to the heater 870B are provided by electrical connections formed along upper surfaces of the end supports 850B and terminating on the landing pads 860B.

It would be evident to one skilled in the art that whilst the MEMS circuit resonators 800A and 800B are shown as discrete MEMS devices that alternatively the electrical interconnections for both the resonator itself, for example first interconnect 830B and coupled interconnect 840B, and the heater 870B, via landing pads 860B are optionally interfaced directly to electrical connections of a CMOS circuit formed within the substrate.

Referring to FIG. 9 shown is a graphical representation of effects of electrical tuning of a MEM resonator employing a SiC structural layer. Shown in the tuning curve 900 are traces for the S21 frequency response of the MEM resonator as a function of bias voltage. As shown traces 910 through 980 depict bias voltages from 90V down to 20V in 10V steps. The resonant frequency shifts from approximately 9.21 MHz to 8.89 MHz over the 70V bias range. However, as can be seen from the curves 910 through 980 there is also a 7 dB variation in the insertion loss of the MEM resonator over this tuning range.

Figure 10:
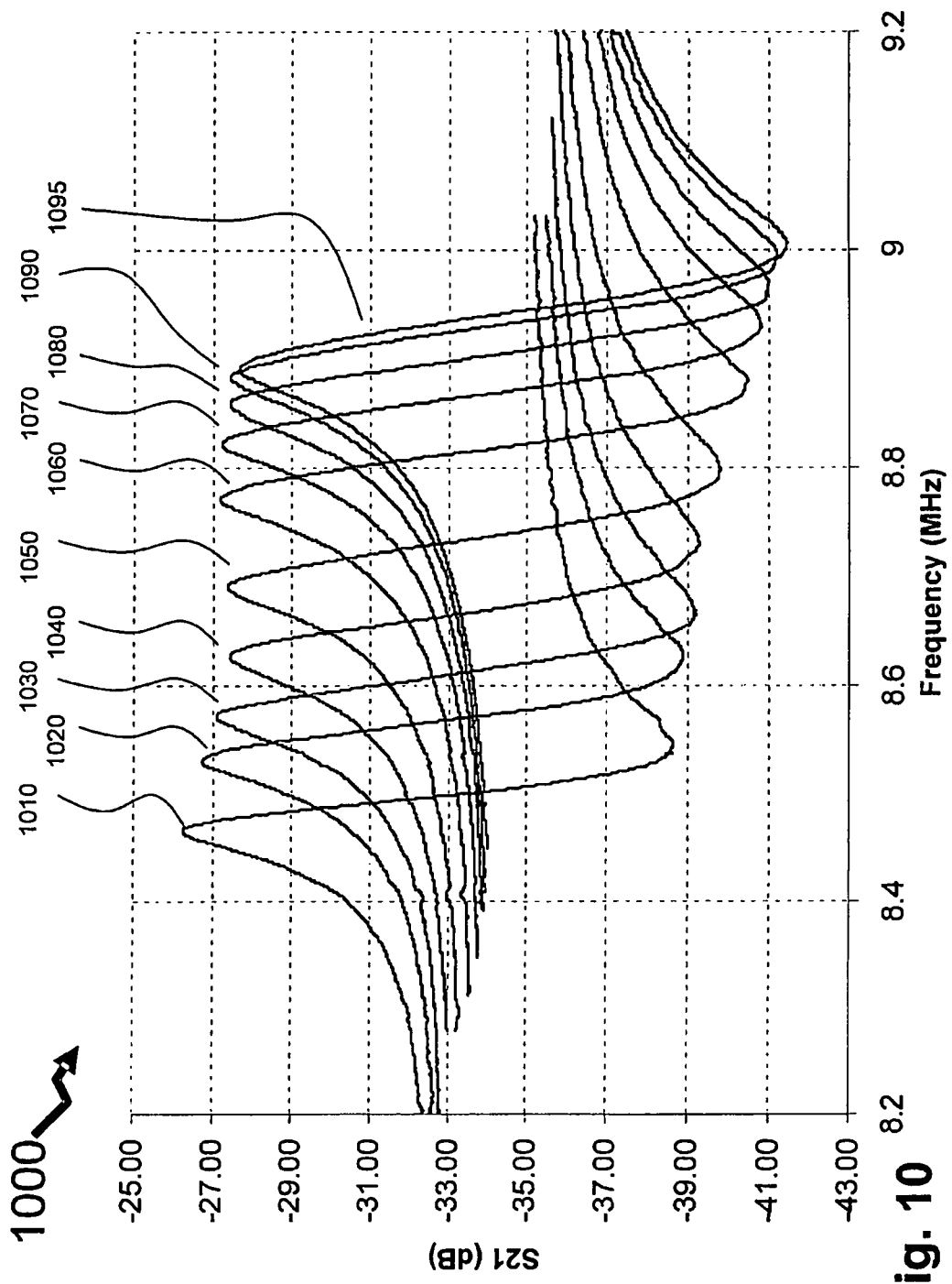
FIG. 10 illustrates exemplary results for the resonator frequency tuning using thermal tuning according to an embodiment of the invention.

Now referring to FIG. 10 there is shown graphically a response of a MEM resonator employing the SiC structural layer and incorporating the heater metallization on the upper surface. Shown in the thermal tuning graph 1000 is initial biased MEM resonator response 1095 centered at approximately 8.89 MHz and having a peak S21 of approximately 27.6 dB. The electrical resistance of the heater implemented within this MEM resonator being 1.4Ω. As the heater is initially increased to 30 mW in 30 mW plot 1090 the frequency shifts down to 8.86 MHz, then 8.83 MHz at 60 mW in 60 mW plot 1080.

In subsequent plots 1070 through to 1010 the electrical power is increased to 120 mW, 150 mW, 170 mW, 200 mW and 225 mW, respectively. As the electrical power increases to the final curve 225 mW plot 1010, the centre frequency has been reduced to approximately 8.46 MHz and the peak S21 has increased to −26.4 dB. Accordingly thermal tuning increased a tuning range from 0.32 MHz by an additional 0.43 MHz with only 1 dB insertion loss variation over the extended range.

Beneficially therefore the embodiments presented hereinabove provide a tuning mechanism that is dependent on material properties and is thus intrinsically less intrusive on linear device operation. Importantly, an SiC based MEM resonator is completely compatible with processing for direct integration of the MEM resonator onto the Si CMOS circuitry.

When multiple beams are present within a same device, thermal tuning allows for each of the beams to be calibrated independent of manufacturing errors thereby improving yield and performance. Providing thermal tuning for a resonator within an integrated CMOS-MEMS manufacturing process potentially provides both increased functionality and performance and results in increased manufacturing yields, reduced costs and truly integrated circuit solutions both in terms of electronics integration and thermal tuning integration. Further, the application of the heating element directly in contact with the resonator device, and the use of a good thermal conductor such as SiC as described in this invention allows for efficient thermal energy transfer and thus rapid thermal tuning of the resonator.

Whilst the embodiments presented supra have been presented in respect of resonators, it would be apparent to one with knowledge of MEMS that thermal tuning is applicable to a wide range of MEMS devices including but not limited to inductors, switches, attenuators, and micro-mirrors. Numerous other embodiments may be envisaged without departing from the spirit or scope of the invention.

What is claimed is:

1. A method comprising:
designing a low temperature MEM device, the low temperature MEM device based upon a semiconductor based manufacturing process comprising at least one semiconductor process for integrating at least an integrated heater directly integrated with a substrate onto which the low temperature MEM device is integrated, each of the at least a semiconductor process limiting the maximum temperature of at least one of the in-process low temperature MEM device and the substrate onto which the low temperature MEM device is being manufactured to below 300° C. the substrate other than a substrate of a package for packaging of at least one of semiconductor integrated circuits and the MEM device substrate.

2. A method according to claim 1 wherein,
the low temperature MEM device comprises at least a conductor formed on a surface of a structural layer, the at least a conductor for forming the heater.

3. A method according to claim 1 wherein,
the at least a semiconductor process includes depositing a structural layer of the MEM device by a sputtering process.

4. A method according to claim 1 wherein,
the at least a semiconductor process includes deposition of an etch-stop layer.

5. A method according to claim 1 wherein,
the at least a semiconductor process includes formation of a bi-layer mask for the etching of at least a structural layer of the MEM device.

6. A method according to claim 1 wherein,
the at least a semiconductor process includes provisioning of a sacrificial layer to provide a release of at least a predetermined portion of the MEM device from the substrate.

7. A method according to claim 1 wherein,
the at least a semiconductor process includes removal of a sacrificial layer allowing release of at least a predetermined portion of the MEM device from the substrate.

8. A method according to claim 1 wherein,
the at least a semiconductor process includes etching of a structural layer of the MEM device.

9. A method according to claim 1 wherein,
the at least a semiconductor process includes deposition of a metallization layer for the provisioning of a heater.

10. A method according to claim 1 wherein,
the at least a semiconductor process includes electrical interconnection of the MEM device to the substrate.

11. A method comprising:
forming a low temperature MEM device, the low temperature MEM device formed with a semiconductor based manufacturing process comprising semiconductor processes including a first semiconductor process for integrating at least an integrated heater of the MEM device directly integrated with a substrate onto which the low temperature MEM device is integrated, each of the semiconductor processes limiting the maximum temperature of at least one of the in-process low temperature MEM device and the substrate onto which the low temperature MEM device is being manufactured to below 300° C. the substrate other than a substrate of a package for packaging of at least one of semiconductor integrated circuits and the MEM device substrate.

12. A method according to claim 11 wherein,
the low temperature MEM device comprises at least a conductor formed on a surface of a structural layer, the at least a conductor for forming the heater, the at least a conductor formed limiting the maximum temperature of at least one of the in-process low temperature MEM device and the substrate onto which the low temperature MEM device is being manufactured to below 300° C.

13. A method according to claim 11 wherein,
the at least a semiconductor process includes depositing a structural layer of the MEM device by a sputtering process performed limiting the maximum temperature of at least one of the in-process low temperature MEM device and the substrate onto which the low temperature MEM device is being manufactured to below 300° C.

14. A method according to claim 11 wherein,
the at least a semiconductor process includes deposition of an etch-stop layer performed while limiting the maximum temperature of at least one of the in-process low temperature MEM device and the substrate onto which the low temperature MEM device is being manufactured to below 300° C.

15. A method according to claim 11 wherein,
the at least a semiconductor process includes formation of a bi-layer mask for the etching of at least a structural layer of the MEM device, the bi-layer mask formed while limiting the maximum temperature of at least one of the in-process low temperature MEM device and the substrate onto which the low temperature MEM device is being manufactured to below 300° C.

16. A method according to claim 11 wherein,
the at least a semiconductor process includes provisioning of a sacrificial layer to provide a release of at least a predetermined portion of the MEM device from the substrate, provisioning performed while limiting the maximum temperature of at least one of the in-process low temperature MEM device and the substrate onto which the low temperature MEM device is being manufactured to below 300° C.

17. A method according to claim 11 wherein,
the at least a semiconductor process includes removal of a sacrificial layer allowing release of at least a predetermined portion of the MEM device from the substrate while limiting the maximum temperature of at least one of the in-process low temperature MEM device and the substrate onto which the low temperature MEM device is being manufactured to below 300° C.

18. A method according to claim 11 wherein,
the at least a semiconductor process includes etching of a structural layer of the MEM device while limiting the maximum temperature of at least one of the in-process low temperature MEM device and the substrate onto which the low temperature MEM device is being manufactured to below 300° C.

19. A method according to claim 11 wherein,
the at least a semiconductor process includes deposition of a metallization layer for the provisioning of a heater while limiting the maximum temperature of at least one of the in-process low temperature MEM device and the substrate onto which the low temperature MEM device is being manufactured to below 300° C.

20. A method according to claim 11 wherein,
the at least a semiconductor process includes electrical interconnection of the MEM device to the substrate while limiting the maximum temperature of at least one of the in-process low temperature MEM device and the substrate onto which the low temperature MEM device is being manufactured to below 300° C.

21. A method comprising:
forming a low temperature MEM device including at least a MEM, the low temperature MEM device formed with a semiconductor based manufacturing process comprising semiconductor processes including a first semiconductor process for integrating at least a heater directly integrated with a substrate onto which the low temperature MEM device is being integrated, each of the semiconductor processes limiting the maximum temperature of at least one of the in-process low temperature MEM device and the substrate onto which the low temperature MEM device is being manufactured to below 300° C. from when the at least a MEM is manufactured until completion of the MEM device.

22. A method comprising:
providing a first substrate;
integrating within the first substrate a low temperature MEM device, the low temperature MEM device based upon a semiconductor based manufacturing process comprising at least one semiconductor process;
integrating at least an integrated heater directly with the substrate into which the low temperature MEM device is integrated using at least a semiconductor process that limits a maximum temperature of at least one of the in-process low temperature MEM device and the substrate onto which the low temperature MEM device is integrated to below 300° C.

* * * * *